United States Patent
Pinnow et al.

(10) Patent No.: US 7,514,362 B2
(45) Date of Patent: Apr. 7, 2009

(54) INTEGRATED CIRCUIT INCLUDING SUB-LITHOGRAPHIC STRUCTURES

(75) Inventors: Cay-Uwe Pinnow, München (DE);
Thomas Happ, Tarrytown, NY (US);
Michael Kund, Tuntenhausen (DE);
Gerhard Mueller, München (DE)

(73) Assignee: Infineon Technologies AG, Munich (DE)

( * ) Notice: Subject to any disclaimer, the term of this patent is extended or adjusted under 35 U.S.C. 154(b) by 325 days.

(21) Appl. No.: 11/258,367

(22) Filed: Oct. 26, 2005

(65) Prior Publication Data

US 2006/0091476 A1 May 4, 2006

(30) Foreign Application Priority Data

Oct. 29, 2004 (DE) .................. 10 2004 052 611

(51) Int. Cl.
*H01L 21/44* (2006.01)
(52) U.S. Cl. .................. 438/672; 438/640; 438/675
(58) Field of Classification Search .................. 438/629, 438/637, 638, 640, 668, 672, 673, 675
See application file for complete search history.

(56) References Cited

U.S. PATENT DOCUMENTS

| 4,409,319 A | 10/1983 | Colacino et al. |
| 4,812,418 A | 3/1989 | Pfiester et al. |
| 4,814,041 A | 3/1989 | Auda |
| 6,028,001 A | 2/2000 | Shin |
| 6,117,720 A | 9/2000 | Harshfield |
| 6,200,735 B1 | 3/2001 | Ikegami |
| 7,081,408 B2 * | 7/2006 | Lane et al. .................. 438/637 |
| 7,297,628 B2 * | 11/2007 | Chao et al. .................. 438/635 |
| 2003/0129818 A1 | 7/2003 | Inai et al. |
| 2004/0166604 A1 | 8/2004 | Ha et al. |
| 2004/0192060 A1 | 9/2004 | Stegemann et al. |

FOREIGN PATENT DOCUMENTS

| DE | 10312469 A1 | 10/2004 |
| EP | 1 557 875 A1 | 7/2005 |
| WO | 2005036625 A1 | 4/2005 |

OTHER PUBLICATIONS

German Office Action for German Patent Application No. 10 2004 052 611.7 dated Oct. 9, 2008 (7 pages).

* cited by examiner

*Primary Examiner*—Kevin M Picardat
(74) *Attorney, Agent, or Firm*—Dicke, Billig & Czaja, PLLC

(57) ABSTRACT

A method which makes it possible to define in a patterning layer openings having a first dimension that is substantially less than the feature size that can be obtained lithographically includes applying a sacrificial layer made of a material that is different from that of the patterning layer in a predetermined layer thickness on the patterning layer. Afterward, a photoresist layer is applied on the surface of the sacrificial layer, and an opening having a second dimension is defined lithographically in the photoresist layer. Afterward, an etching angle is set in a manner dependent on the layer thickness of the sacrificial layer and also the first and second dimensions, and the sacrificial layer is etched at the etching angle set. Afterward, the patterning layer is etched, the sacrificial layer is removed and a filling material is introduced into the opening produced in the patterning layer.

11 Claims, 19 Drawing Sheets

INTEGRATED CIRCUIT INCLUDING SUB-LITHOGRAPHIC STRUCTURES

CROSS REFERENCE TO RELATED APPLICATIONS

This application claims priority under 35 U.S.C. §119 to German Application No. DE 10 2004 052 611.7, filed on Oct. 29, 2004, and titled "Method for Producing an Opening Which is at Least Partly Filled with a Filling Material, Method for Producing a Memory Cell, and Memory Cell," the entire contents of which are hereby incorporated by reference.

FIELD OF THE INVENTION

The present invention relates to a method for producing an opening which is at least partly filled with a filling material. In particular, the present invention relates to the production of sub-lithographic structures, i.e., structures having lateral dimensions that cannot be produced by conventional lithography methods. In one non-limiting application, the method according to the invention is suitable for producing sub-lithographic metal contacts having dimensions in the range of approximately 1 to 70 nm.

BACKGROUND

The resolution limit of lithography is typically limited by the wavelength of the light used and the numerical aperture of the illumination system used. The following holds true: $a = k \cdot \lambda / NA$, where k is the coherence factor of the radiation having the wavelength $\lambda$ and NA designates the numerical aperture. To fulfill specific technological requirements, it is necessary in some applications in semiconductor technology and fabrication to produce very small structures, in particular even the smallest possible structures, which have to far surpass the resolution capability of lithography.

Lithography methods employed at the present time use excimer lasers as a light source, for example ArF lasers having a wavelength of 193 nm or KrF lasers having a wavelength of 248 nm. In this case, it is possible to achieve a maximum resolution of approximately 65 nm, i.e., the minimum size or dimension that can be produced or the minimum spacing that can be produced for structures is about 65 nm.

There are areas of application in which structures having a smaller size or dimension than 65 nm are particularly desirable.

Semiconductor memory cells such as, for example, PRAMs or PCRAMs include phase change materials. Phase change random access memories are non-volatile memories that exploit the properties of a phase change material whose electrical resistance changes greatly in accordance with its crystalline phase. Examples of phase change materials of this type are chalcogenides, i.e., compounds or alloys of the elements of group VI of the periodic table. By heating a phase change material and allowing it to cool down in accordance with a predetermined temperature profile, the phase of the phase change material is altered to a crystalline or amorphous state, thereby producing a characteristic resistance value in each case. The associated temperature profile is caused by impressing a corresponding current profile.

By way of example, a memory cell in the amorphous state is programmed by heating the phase change material to a temperature lying between the crystallization temperature and the melting point, and maintaining this temperature long enough (approximately 50 ns) to obtain a crystalline state having a low resistance value. This is realized by applying a current pulse having a suitable amplitude and a corresponding duration. Conversely, during an erasure operation, the phase change material is heated to a temperature lying somewhat above the melting point of the phase change material by applying a relatively high current pulse for a short time duration. The phase change material is subsequently cooled rapidly. As a result, the phase change material layer is altered in such a way that it is present in an amorphous phase having a high resistance value. In the case of the phase change materials that are usually used, the resistance values of the respective phases differ by in each case approximately 100 fold, so that the presence of a specific phase can be unambiguously identified by measuring the resistance value.

In order to realize a desired phase change from amorphous to crystalline or from crystalline to amorphous with a smallest possible impressed current, great current concentration (i.e., generation of a high current density) is necessary. The known PCRAMs are primarily realized as so-called heater cells, in which a buried metal contact makes contact with the active phase change material deposited in planar fashion, see for example "OUM—A 180 nm Nonvolatile Memory Cell Element Technology for Stand alone and embedded Applications" by Stefan Lai and Tyler Lowrey, IEDM Tech. Dig. 2001, page 36.5. In this case, a high current density can be obtained by a reduced conductor cross-section of the metal contact and, in particular, by using a sub-lithographic metal contact.

FIG. 8 shows a schematic cross-section through the memory node of a memory cell having phase change material (PCRAM). A second electrode 20 is arranged on the top side of a layer made of a phase change material such as, for example, a polycrystalline chalcogenide. A heater or an electrical contact 21 is locally connected to a volume 23 of the layer made of the phase change material 22 that is to be programmed. The conductive layer is connected to a first electrode 19 at the other side. If a current then flows between the first and second electrodes 19, 20, the region 23 is locally heated and thus transferred from a crystalline to an amorphous state, or vice versa.

A metal contact having a sub-lithographic dimension can be realized via a spacer process, for example. First, a spacer layer, for example made of $SiO_2$, is deposited conformally in a suitable layer thickness d. The horizontal part of the spacer layer is subsequently removed by an anisotropic etching. As a consequence, the cross-section of the associated contact opening is reduced by the size 2×d. Afterward, a layer made of a conductive material, for example a titanium nitride layer, is deposited via a CVD method and planarized using a CMP (chemical mechanical polishing) method.

This technique is associated with the problem that it is nevertheless not possible to realize arbitrarily small dimensions of the metal contacts. Moreover, it is necessary to deposit the spacer layer conformally, which is usually effected via a CVD method. Since high temperatures are possibly required for a conformal layer deposition, this gives rise to the disadvantage, however, that the thermal budget of the component is burdened by this step.

The production of Si quantum wires having a width of less than 30 nm via a spacer process is disclosed in Jaewoo Kyung, "Fabrication of sub-30 nm nanowires", School of Electrical Engineering, Seoul Nat. Univ., SMDL Annual report 2002.

A further disadvantage of producing structures using the spacer technique results from the fact that it is not possible to produce such contacts with particularly small spacings of less than, for example, the minimum size that can be obtained lithographically.

Further PCRAM memory cell concepts are disclosed in U.S. Pat. No. 6,740,921 and U.S. Patent Application Publication No. U.S. 2004/0164290.

SUMMARY

The present invention provides an improved method for producing an opening which is at least partly filled with a filling material. The present invention further provides an improved method for producing a PCRAM memory cell, and also a corresponding PCRAM memory cell.

According to the present invention, a method for producing an opening which is at least partly filled with a filling material and has a first dimension in a patterning layer, includes: applying a sacrificial layer made of a material that is different from that of the patterning layer in a predetermined layer thickness on the surface of the patterning layer, applying a resist layer on the resulting surface, lithographically defining an opening having a second dimension in the resist layer, the second dimension being greater than the first dimension, setting an etching angle in a manner dependent on the layer thickness of the sacrificial layer and also the first and second dimensions, etching the sacrificial layer at the etching angle set, etching the patterning layer, removing the sacrificial layer, and introducing a filling material into the opening produced in the patterning layer.

The present invention thus provides a method in which, by a tapered etching of a sacrificial layer, i.e., an etching in which the cross section or the dimension of the opening produced is larger in an upper region of the sacrificial layer than in a lower region, a structure refinement of the opening produced is obtained. The refined structure produced is transferred into the patterning layer, it also being possible to effect etching in the patterning layer in such a way that the dimension of the structure produced decreases. After the sacrificial layer has been removed and the opening has been filled with a filling material, openings are obtained having a dimension which is substantially smaller than that previously designed lithographically. In particular, it is thereby possible to produce openings having a sub-lithographic dimension, that is, a dimension which is substantially smaller than that which can be achieved lithographically.

In this connection, the term "dimension" designates a diameter, in particular the smallest diameter of the opening produced. The opening produced may be for example a hole-like opening with an oval, rectangular, round or other cross-section in plan view. However, it may also be embodied as a trench running along a specific direction. The present invention provides for, in particular, the smallest diameter of the opening along a specific cross-sectional direction and at a specific height of the patterning layer, to be smaller than the minimum size that can be achieved lithographically.

In this case, the sacrificial layer is constructed from a material that is different from that of the patterning layer and, in particular, can be etched selectively with respect to the patterning layer. The layer thickness of the sacrificial layer is set in accordance with the minimum feature size to be produced and the etching angle provided.

The etching method used may be a dry etching method, in particular chemico-physical dry etching such as, for example, reactive ion etching. In this case, the etching angle can be set by setting the parameters flow rate, substrate temperature, partial pressure of the etching gas, or the etching gases.

The resist layer can be patterned by suitable lithographic methods. By way of example, it is possible to use a photoresist layer that can be patterned by photolithographic methods. In particular, the resist layer may also comprise an ARC layer (a reflection-reducing layer). The resist layer may also be constructed from a plurality of resist layers and, if appropriate, a reflection-reducing layer.

In addition to the photolithographic methods usually used for patterning the resist layer, it is also possible to employ any other methods desired, such as, for example, electron beam lithography, ion projection lithography, (nano-)imprint lithography, in order to expose and develop the resist layer or the resist layer system.

The patterning layer may be any desired layer in which the openings are patterned. By way of example, if conductive contacts are to be produced, the patterning layer may be produced from an insulating material which mutually electrically insulates the contacts. However, it may also be removed after the openings have been filled with the filling material.

According to the present invention, it is preferred for the etching angle to be determined in a manner additionally dependent on the layer thickness of the patterning layer and the patterning layer to be etched at the etching angle set. Optionally, the patterning layer can be etched at an approximately perpendicular angle, i.e., at an angle in a range of 85 to 90°, relative to the substrate surface.

In particular, it is possible, by way of example, for both the sacrificial layer and the patterning layer to be etched with a predetermined setting of the parameters flow rate, substrate temperature and partial pressure of the etching gas or the etching gases. In this case, the parameters are set in such a way that etching is effected in the sacrificial layer at a specific etching angle that deviates from the etching angle in the patterning layer. This is because the etching angle in the patterning layer in turn depends on the etching chemistry, the chemical composition of the patterning layer and also the topographical conditions (thickness of the sacrificial layer and thickness of the patterning layer).

It is also possible to alter the etching parameters after the opening has been etched in the sacrificial layer and the etching operation in the patterning layer begins. The end of the etching operation within the sacrificial layer may be established for example after a predetermined time duration has elapsed or by an end point identification.

Typical etching angles that can be set in accordance with the present invention lie in a range of approximately 70°-90° relative to the substrate surface.

Preferably, the method according to the invention additionally includes etching back the filling material after removing the sacrificial layer. In this case, it is possible to realize even smaller dimensions of the filled openings. If the filled openings produced are used as electrical contacts, for example, it is thereby possible to obtain a further increase in the current density. The partial etching-back may be realized by ending the etching-back operation after a time duration determined beforehand. It is likewise possible for the filling material to be constructed from two or more layers, and for example for the topmost layer to be etched away, while the lower layer remains as an etching stop layer.

Examples of the filling material include, in particular, conductive materials such as, for example, titanium nitride, tungsten, polycrystalline silicon or others and, in particular, combinations of a plurality of layers made of these materials, for example a TiN/W layer stack. However, the filling material may, of course, also be a different semi-conducting or insulating material, or a phase change material, if the intention is to produce memory cells having particularly small dimensions, by way of example.

The filling material may also be a monocrystalline semiconductor material, in particular monocrystalline silicon, which is introduced into the openings by a selective epitaxy method, by way of example. It is likewise possible for the filling material to be a covering material for a subsequent etching step for etching the material of the patterning layer and, if appropriate, the underlying substrate material.

The filling material may be deposited by generally used methods, such as, for example, PVD (physical vapor deposition), CVD (chemical vapor deposition), or ALD (atomic layer deposition) methods. If a low-temperature method is used for the deposition, then this affords the advantage that the thermal budget of the component is not burdened thereby.

The present invention furthermore provides a method for producing a semiconductor memory cell, including: providing a selection transistor having a first terminal and a second terminal, a channel arranged between the terminals, and a control terminal suitable for controlling the conductivity of the channel; providing a memory element comprising a phase change material and a conductive contact connected to the phase change material and the second terminal of the selection transistor, the conductive contact being produced by performing the method described above.

The method according to the invention thus makes it possible to provide a semiconductor memory cell in which the phase change material is heated by a conductive contact whose cross-section or dimension can be produced in particularly small fashion.

In particular, it is possible to produce the conductive contact in such a way that its dimension is in the range of approximately 1 to 70 nm. It is thereby possible to produce a conductive contact having a substantially smaller dimension than can be obtained with conventional methods.

In this case, the phase change material is a material which has a significantly different resistance value depending on whether it is present in a crystalline or amorphous phase. In particular, it is preferred for the resistance value of the two phases to differ by at least a factor 10, and more preferably by a factor 100. Examples for suitable phase change materials include, for example, chalcogenides, typically in the form of alloys containing antimony and/or tellurium. In particular, GeSbTe or AgInSbTe alloys with suitable stoichiometric ratios are preferred. Furthermore, the phase of the phase change material can be altered from amorphous to crystalline or from crystalline to amorphous by applying a suitable temperature profile.

The present invention furthermore provides a semiconductor memory cell including: a selection transistor comprising a first terminal and a second terminal, a channel arranged between the terminals, and a control terminal suitable for controlling the conductivity of the channel; and a memory element comprising a phase change material and a conductive contact connected to the phase change material and the second terminal of the selection transistor, in which a dimension of the conductive contact is in the range of approximately 1 to 70 nm.

The memory element may also comprise a first electrode which is connected to the second terminal of the selection transistor and to the conductive contact and a second electrode connected to the phase change material.

In this case, the second electrode may directly adjoin the phase change material. However, it is also possible for the second electrode, analogously to the first electrode, to be connected to the phase change material via a second conductive contact, which can likewise be produced by the method according to the invention.

The selection transistor may be embodied as a field effect transistor having a first and second source/drain region and a gate electrode serving as control terminal.

The selection transistor may also be realized as a bipolar transistor having an emitter terminal and a collector terminal and also a base terminal serving as control terminal. In this case, it may be embodied in particular as an npn or pnp transistor, it being possible for the emitter or collector terminal to be connected to the conductive contact of the memory element.

In particular, the selection transistor may be configured as a vertical transistor, i.e., a transistor whose channel runs perpendicularly to the substrate surface. It is thereby possible for the space requirement of the memory cell to be miniaturized further.

The dimension of the conductive contact is preferably 1 to 20 nm and particularly preferably 1 to 15 nm.

The present invention furthermore also provides a method for producing a projecting structure made of a filling material on a substrate comprising: applying a patterning layer on the substrate, performing the method described above, and removing the patterning layer.

Furthermore, the invention provides a projecting structure made of a filling material on a substrate, the projecting structure having a smallest lateral dimension of 1 to 25 nm. In this case, it is particularly preferred for the projecting structure to have a smallest lateral dimension of 1 to 15 nm. The term "smallest lateral dimension" designates a smallest dimension, i.e., a smallest diameter, in a direction parallel to the substrate surface.

BRIEF DESCRIPTION OF THE DRAWINGS

The present invention is described in detail below with reference to the accompanying drawings, in which.

DETAILED DESCRIPTION

Figure 1:
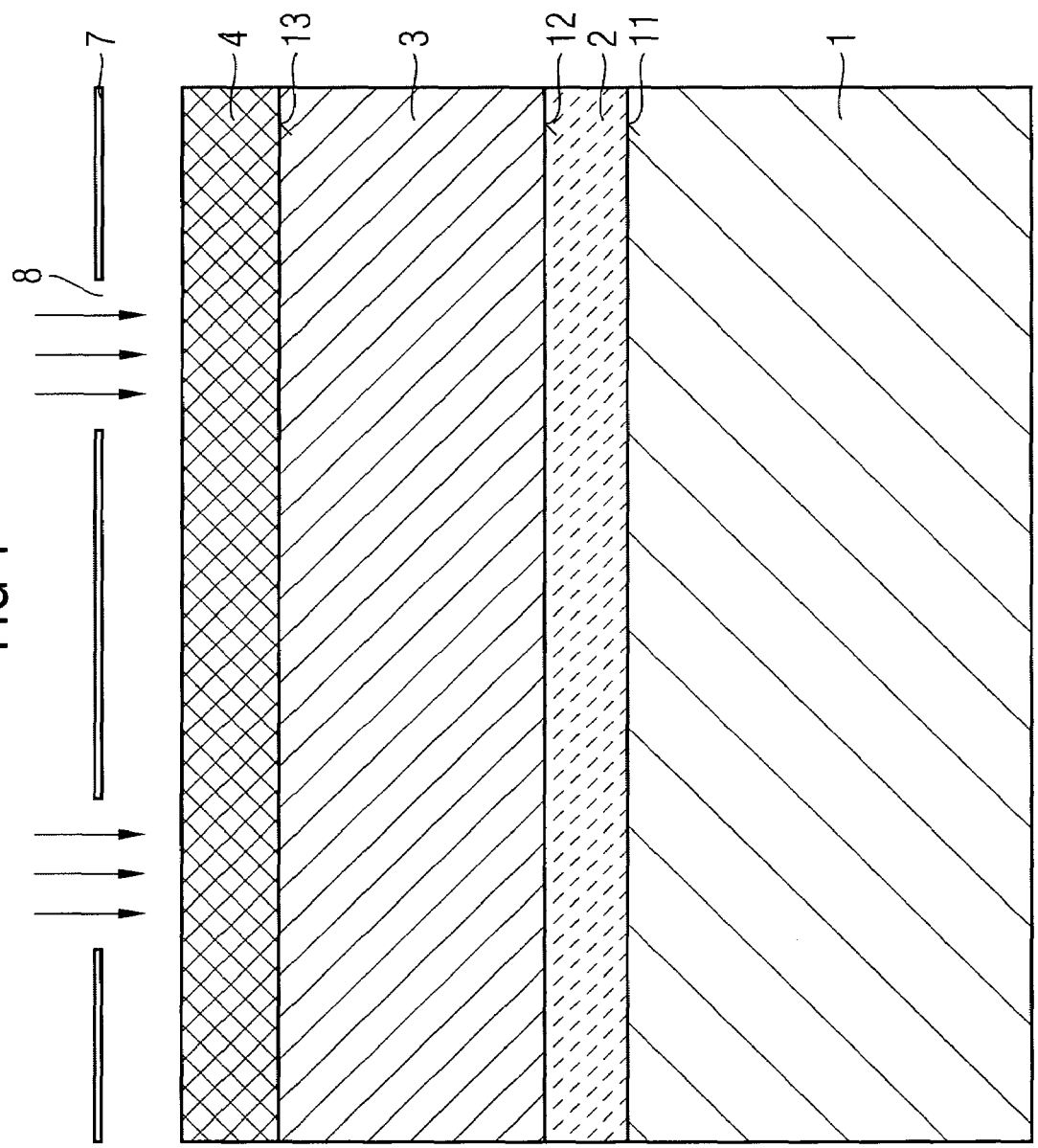
FIGS. 1-7 show a semiconductor structure at various stages of a manufacturing method according to a first exemplary embodiment of the present invention.

In FIG. 1, reference symbol 1 designates a substrate, for example a semiconductor substrate, in particular a silicon substrate or another arbitrary layer carrier, for example an already processed semiconductor wafer with a multiplicity of deposited and patterned layers. A patterning layer 2 to be patterned, for example made of silicon nitride, is provided on the surface 11 of the substrate 1. The patterning layer 2 usually has a layer thickness corresponding approximately to the dimension of the opening to be produced, with the result that an aspect ratio of depth to width of the opening produced of approximately 1:1 is finally obtained. The layer thickness of the patterning layer 2 is correspondingly in the range of approximately 1 to 70 nm if the dimension of the opening to be produced is intended to be in the range of approximately 1 to 70 nm.

In order to carry out the method according to the exemplary embodiment of the invention, a sacrificial layer 3 is applied to the surface 12 of the patterning layer 2. The sacrificial layer 3 is constructed from a material that differs from that of the patterning layer 2. The thickness of the sacrificial layer 3 is usually selected in accordance with the structure miniaturization to be obtained. The greater the structure miniaturization must prove to be, the thicker the dimensioning of the sacrificial layer 3 also must be. In this case, the structure miniaturization corresponds to the ratio of lithographically obtainable resolution and dimension of the opening in the patterning layer.

A typical thickness of the sacrificial layer is approximately 100 nm. The sacrificial layer 3 may be constructed from silicon dioxide, for example. A photoresist layer 4 or a photoresist layer system which, for example, additionally comprises a reflection-reducing layer is applied on the surface of the sacrificial layer 3 according to known methods.

Figure 2:
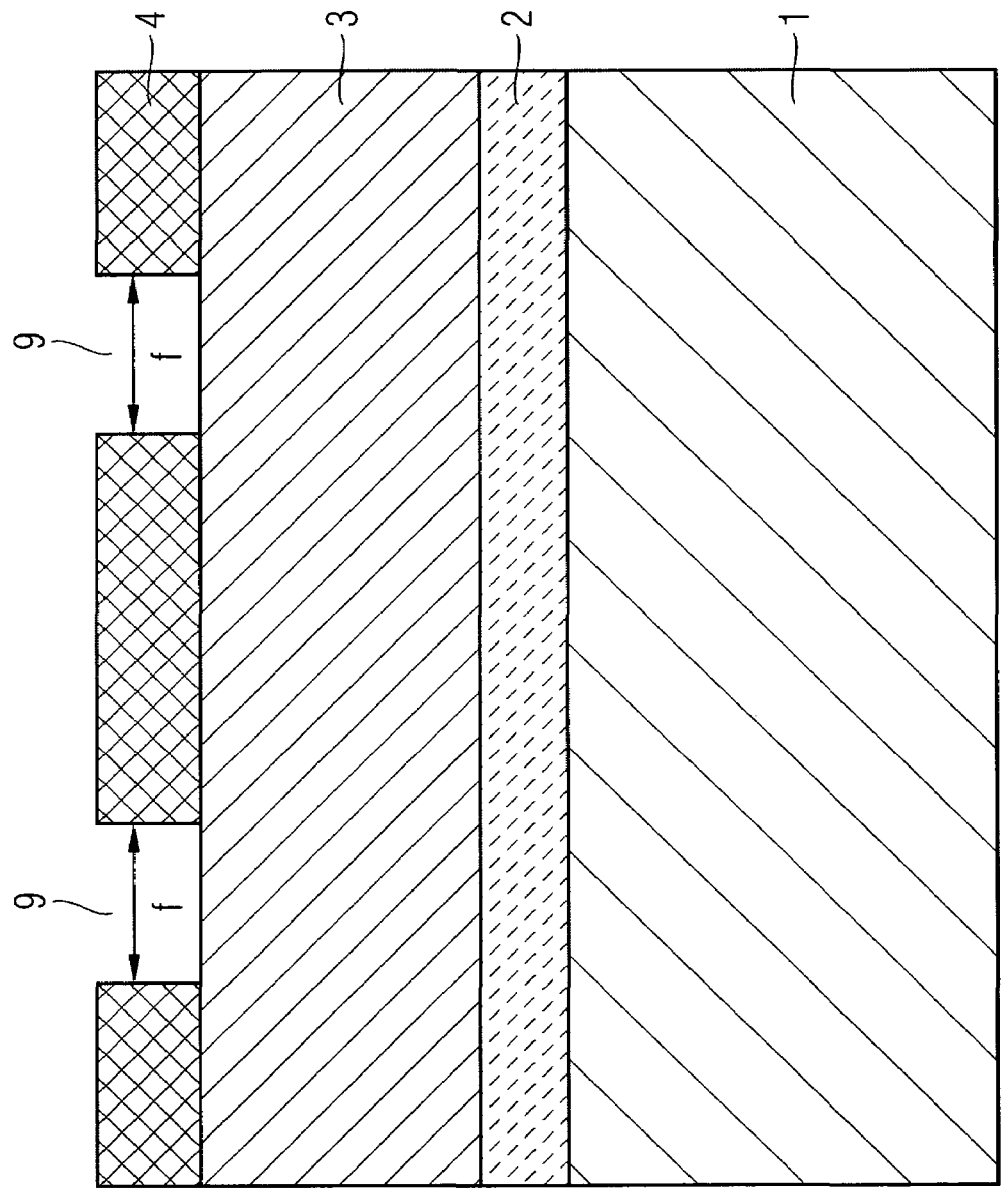

Using a customary mask 7, the photoresist layer 4 is subsequently exposed lithographically by means of known methods, for example using an ArF excimer laser. By developing the photoresist layer 4, the openings 8 in the mask 7 are transferred into the photoresist layer 4, as is illustrated in FIG. 2. In this case, the feature size f of the openings 9 in the photoresist layer corresponds to the resolution limit of the lithography.

Given an exposure wavelength used of 193 nm, f is approximately 90 to 100 nm. In a next step, an etching method is carried out in order to etch openings in the sacrificial layer 3. In the case where an SiO$_2$ sacrificial layer is used, the etching method used is a reactive ion etching method using argon gas. When this etching method is employed, the etching angle can be set for example by setting the parameters flow rate of the etching gas, substrate temperature or partial pressure of the etching gas. An etching angle of 70 to 90° is typically set.

Figure 3:
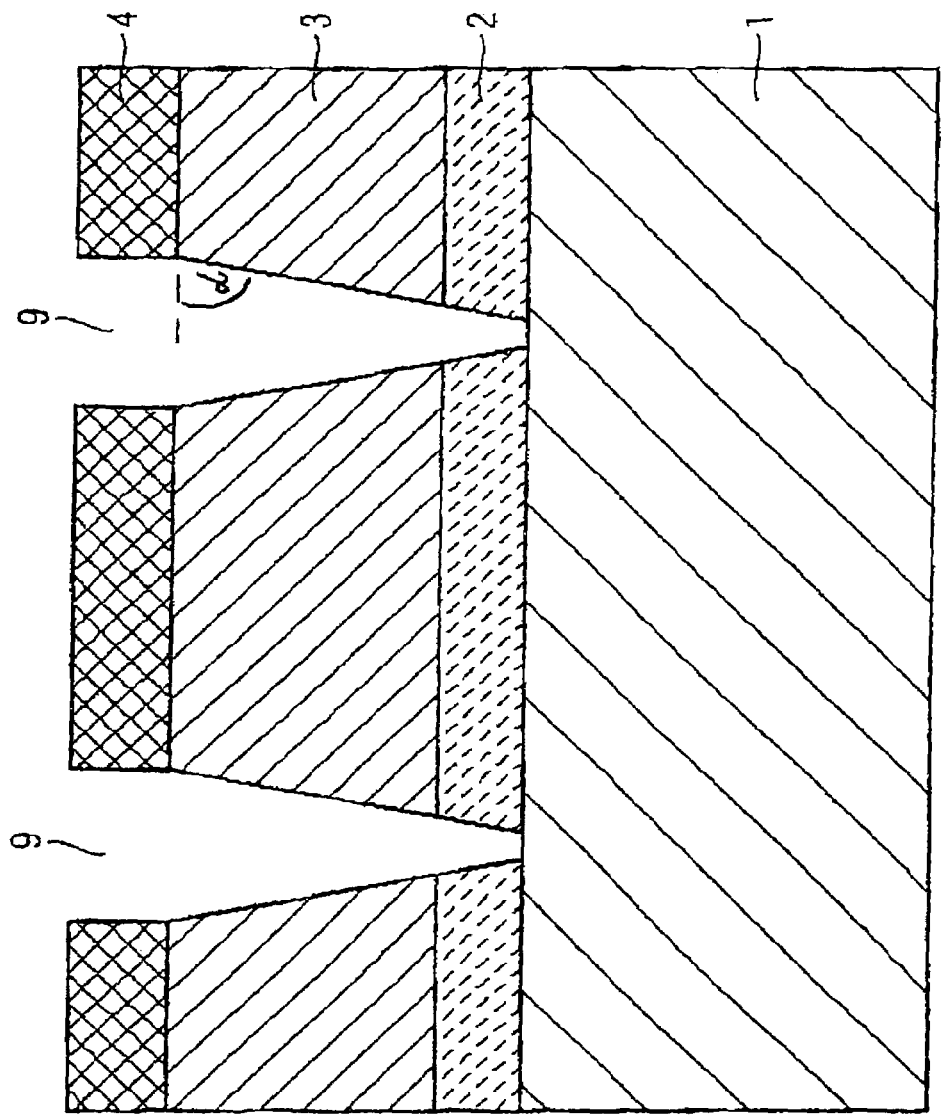

The etching angle is relative to the substrate surface and illustrated as etching angle α in FIG. 3. More precisely, the invention provides, in particular, for the etching angle α to be less than 90°.

As is illustrated in FIG. 3, the etching angle set may also be used for the etching of the patterning layer 2. In general, this can be achieved by altering the etching parameters in a suitable manner after the sacrificial layer has been etched.

The etching operation is ended after reaching the surface of the layer lying below the patterning layer, or the substrate surface 11, after a predetermined time duration. Afterward, the photoresist layer 4 and the sacrificial layer 3 are removed selectively for example by a wet-chemical method or by chemical mechanical polishing, thus resulting in the construction shown in FIG. 4.

Figure 4:
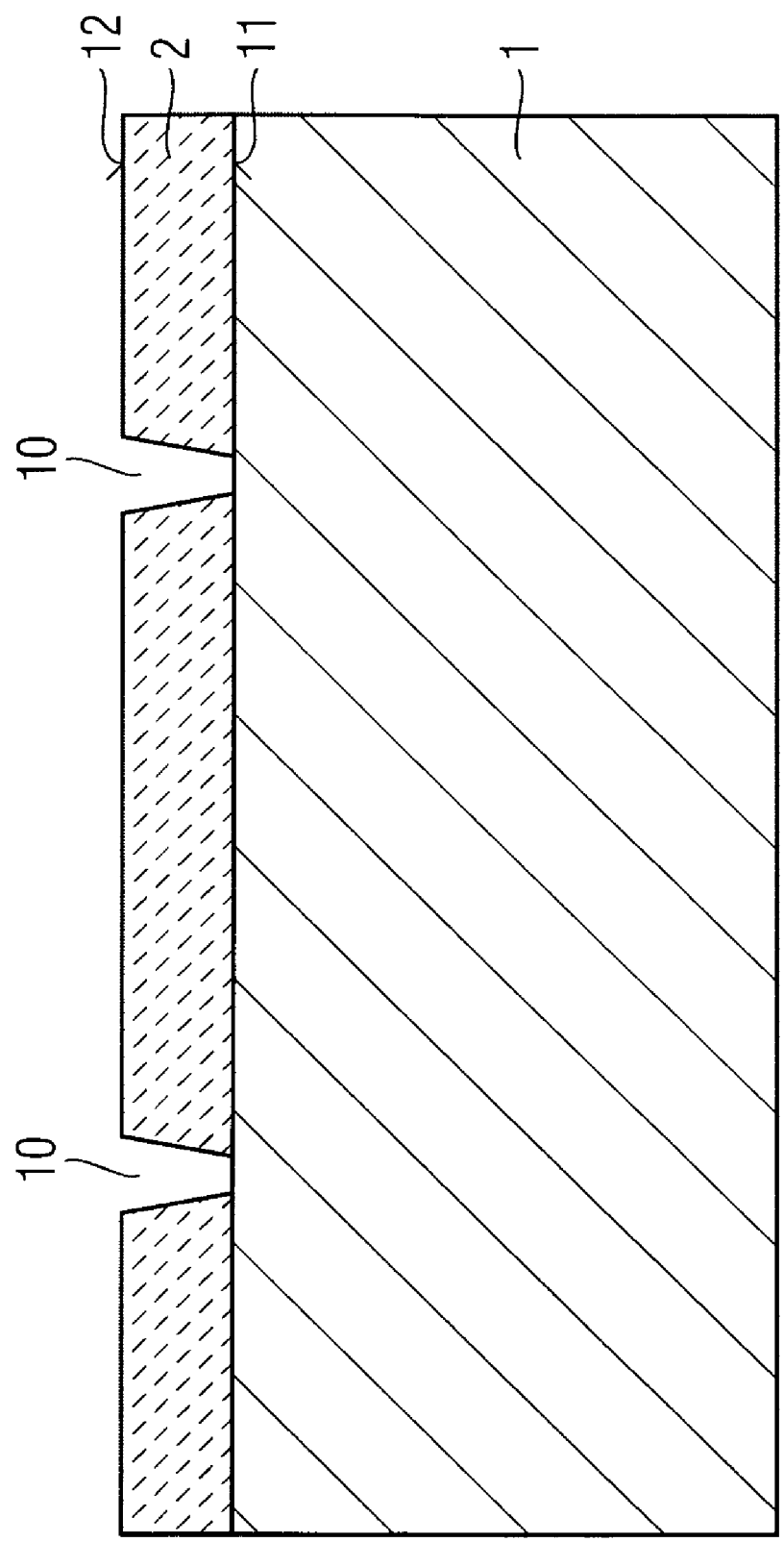

As is shown in FIG. 4, openings 10 whose dimension or diameter is smaller than the previously defined minimum feature size f have been formed in the patterning layer 2.

Next, a layer made of a filling material 14 is applied over the whole area. The material 14 may be for example titanium nitride or tungsten or a combination of these layers. The filling material 14 situated outside the opening 10 produced is removed by chemical mechanical polishing, stopping on the patterning layer 2. The resulting construction is shown in FIG. 5.

Figure 5:
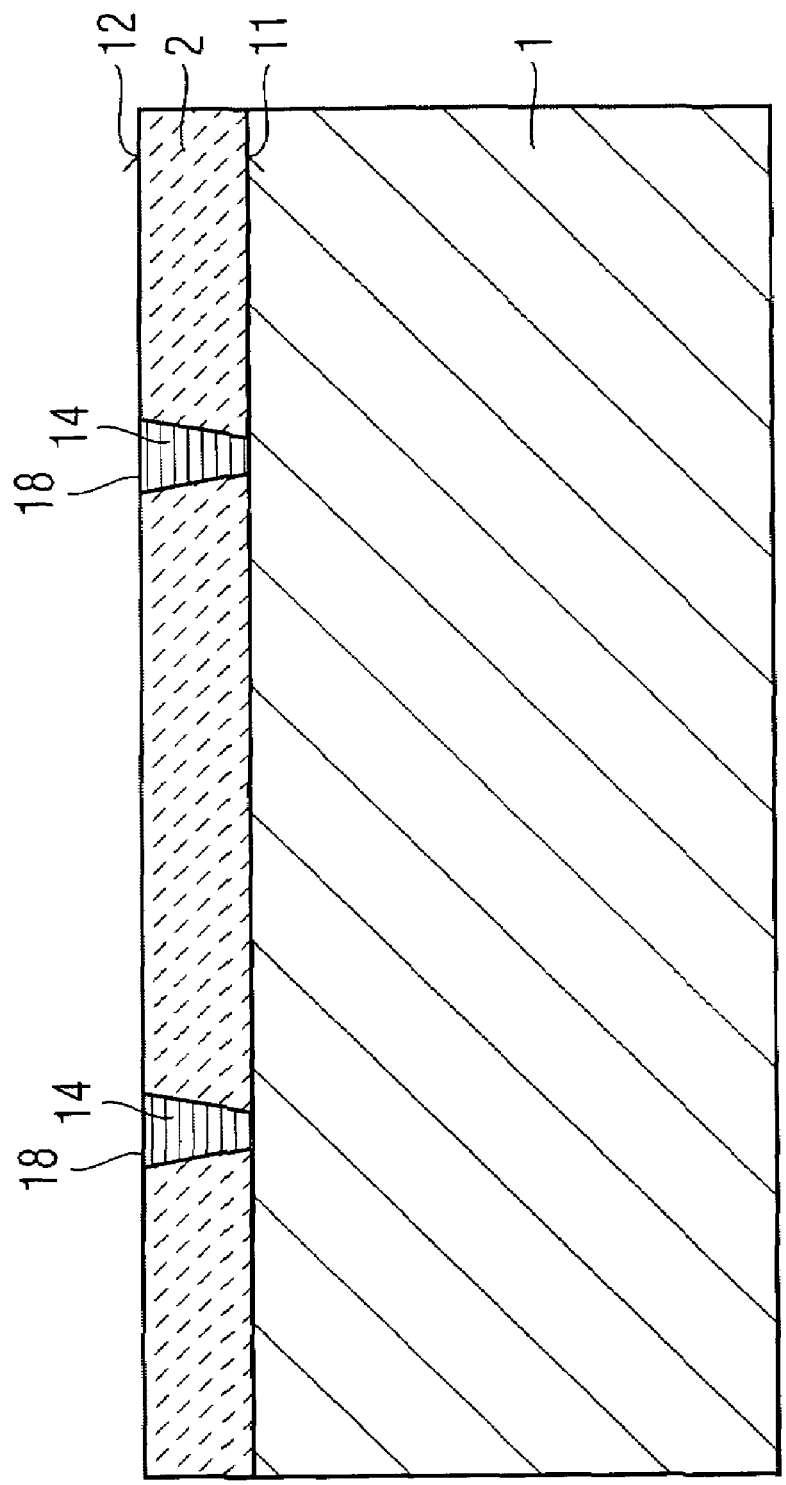

As can be seen in FIG. 5, contact structures 18 or openings filled with the filling material 14, which have a dimension which is substantially smaller than the lithographically defined dimension f, have now been formed. In particular, the opening in the region of the surface 12 of the patterning layer 2 is already significantly smaller than the lithographically defined dimension f. By way of example, the dimension of the openings 10 may be approximately 1 to 70 nm.

Figure 6:
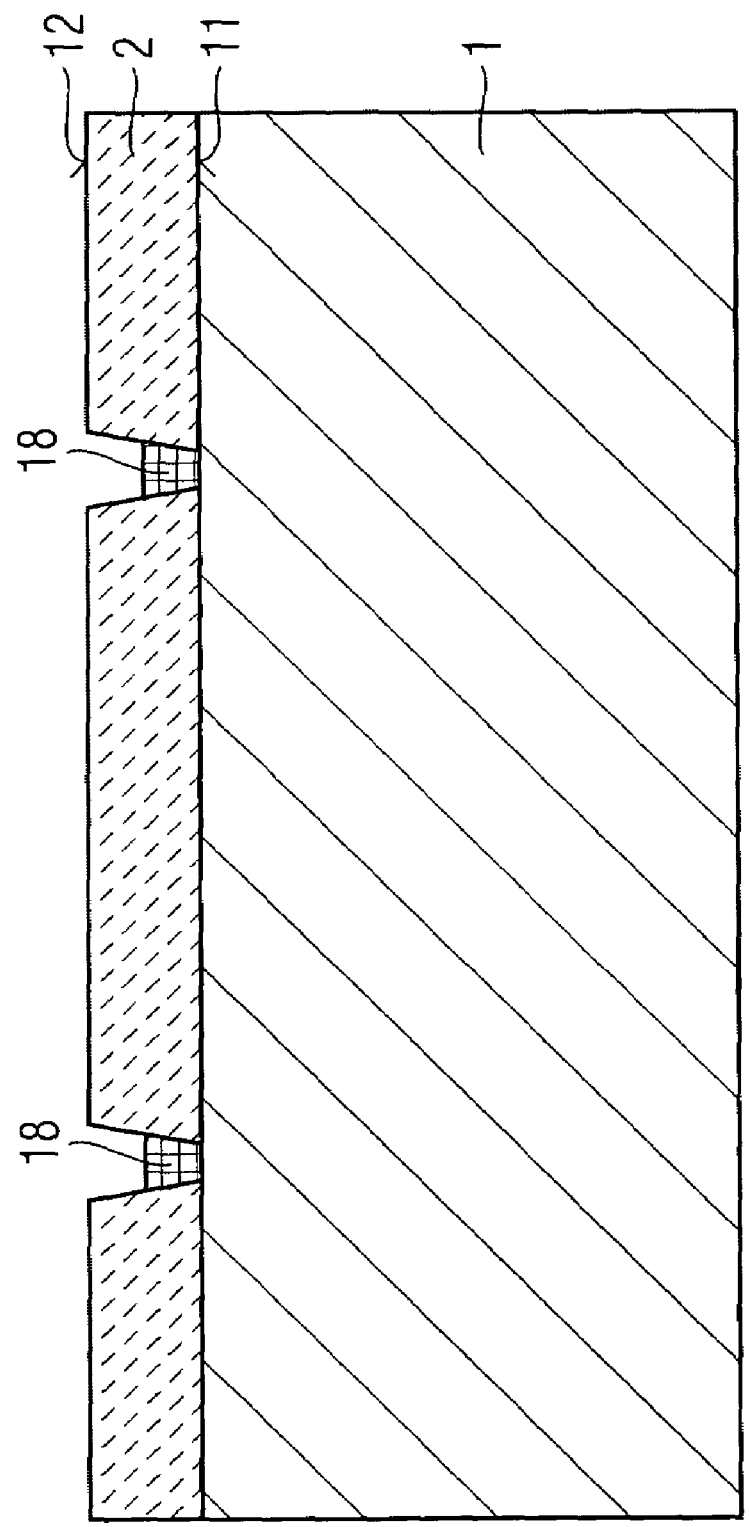

FIG. 6 shows a modification of the first embodiment, in which the filling material is etched back. The dimension, i.e., the upper diameter, of the contact structures is decreased further as a consequence. The depth of the etching-back is in this case is set by the time duration of the etching.

Figure 7:
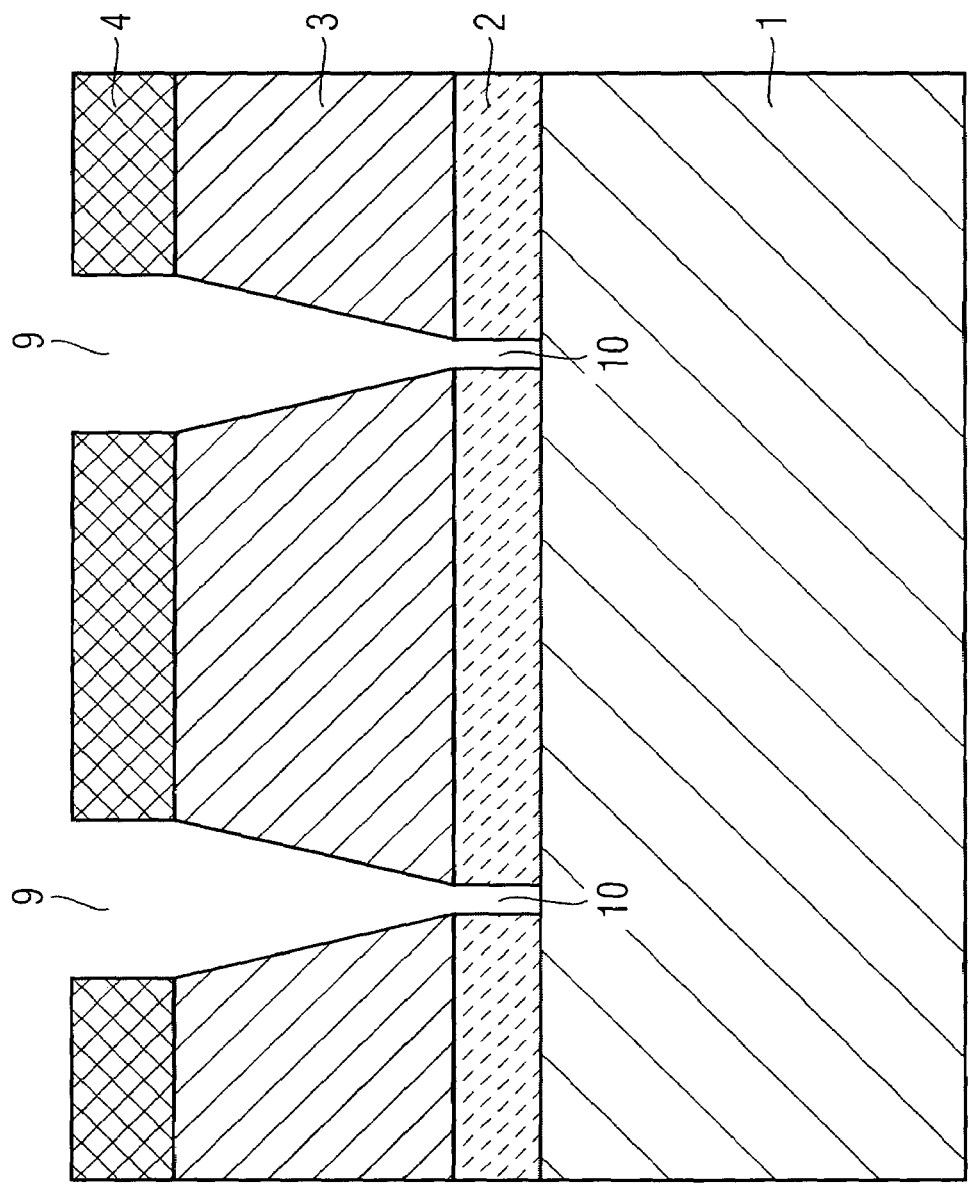

FIG. 7 shows a further modification of the first embodiment. In this case, the etching angle for etching the layer 3 is set to a different value than the etching angle of the patterning layer 2. In particular, it is possible to set the etching angle of the patterning layer 2 in such a way that the patterning layer 2 is etched at an approximately perpendicular etching angle, i.e., approximately 85 to 90°, relative to the substrate surface. In this case, the etching angle may be set independently of the thickness of the patterning layer 2, and as a result the structure produced has a cross-section that remains constant in the depth direction.

Furthermore, according to the exemplary embodiment of the present invention, the sacrificial and patterning layers can be etched with the setting of the etching parameters remaining constant, in which case generally the etching angles in the two layers will be different. The parameters have to be set in a suitable manner in this case, so that the desired dimensions of the openings are produced within the patterning layer, taking account of the two different etching angles.

Figure 8:
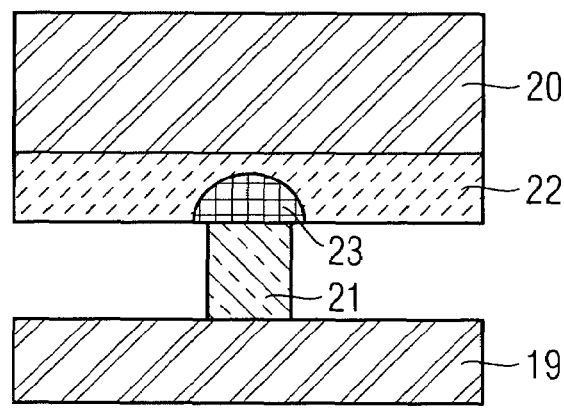
FIG. 8 shows a circuit diagram of a PCRAM memory cell.

The method according to the invention can be used particularly advantageously in the production of a PCRAM memory cell, as shown schematically in FIG. 8.

Figure 9:
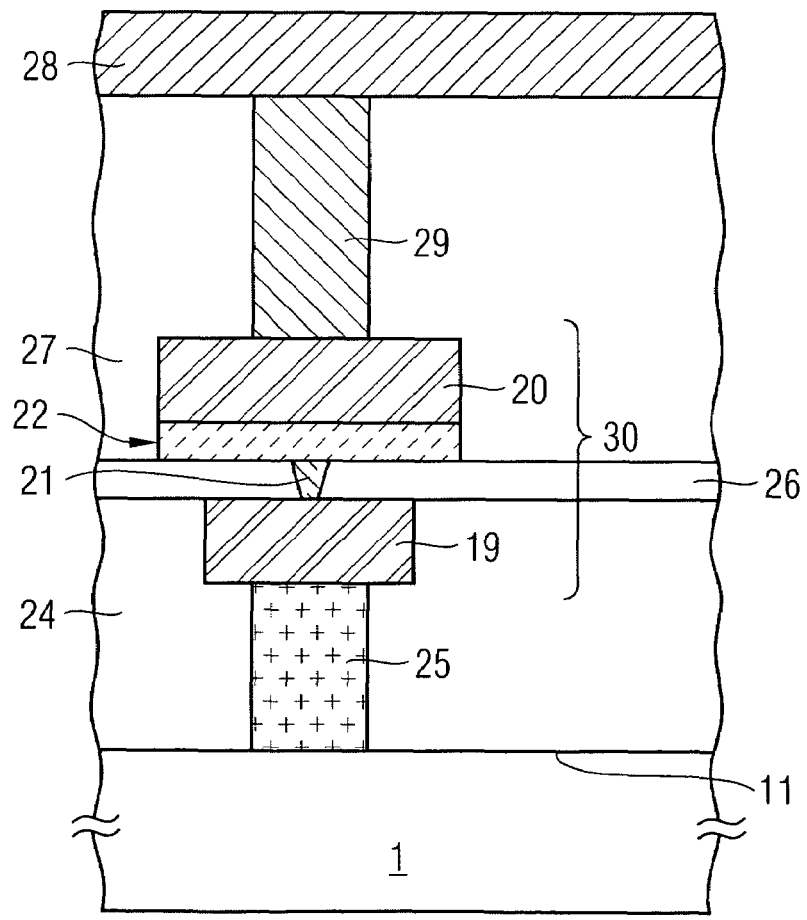
FIG. 9 shows an exemplary cross-section through a PCRAM memory cell.

To produce the structure shown in FIG. 9, first, a transistor (not illustrated) having a first and second source/drain region, a channel arranged in between, and a gate electrode suitable for controlling the conductivity of the channel is formed in a semiconductor substrate 1. A dielectric layer 24 is then applied on the surface 11 of the semiconductor substrate 1 by known methods. For patterning the memory node 30, the contact 25 and the first electrode 19 are subsequently formed in the dielectric layer 24 according to known methods. A second dielectric layer 26 is then applied on the resulting structure. A conductive contact or heater 21 is subsequently formed in the second dielectric layer 26. The contact 21 is formed by the method described above, with the result that the dielectric layer 26 performs the role of the patterning layer 2 and the conductive contact 21 performs the role of the contact structure 18 produced.

More specifically, to produce the conductive contact 21, a sacrificial layer 3 as shown in FIG. 1 is first applied on the surface of the dielectric layer 26, and a photoresist layer 4 is subsequently applied, which is exposed photolithographically according to known methods. After the photoresist layer 4 has been developed, the sacrificial layer is etched at a predetermined etching angle until the dielectric layer 26 is reached. The dielectric layer 26 can then be etched at the same or a deviating etching angle. Afterward, the conductive material for the contact, for example titanium nitride or tungsten, is applied according to known methods and etched back again by chemical mechanical polishing, thus resulting in the openings filled with the filling material.

The phase change material 22 is subsequently applied and patterned. The present embodiment provides for the layer of the phase change material 22 to be patterned in such a way that a section of the phase change material 22 that is insulated from the adjacent cells is provided for each memory cell. As an alternative, however, it is also possible for the layer made of the phase change material 22 to be deposited over the whole area. Insulation of the memory cells from one another is achieved by virtue of the fact that the electrical contact 21 only locally heats the region to be programmed.

After the deposition of the layer made of the phase change material 22, the material of the second electrode 20, for example titanium nitride, is deposited, so that both layers 20, 22 are patterned simultaneously in the subsequent step. A third dielectric layer 27 is subsequently deposited. Contact structures 29, which connect the second electrode 20 externally are subsequently defined according to known methods and filled with a suitable conductive material. Finally, the bit lines 28 are formed on the resulting structure according to known methods.

Alternatively, the first electrode shown in FIG. 9 may also be omitted, so that the heater 21 performs the function of the first electrode 19 and is thus directly in contact with the contact 25 or the substrate 1, or the second source/drain electrode of the selection transistor.

As is shown in FIG. 9, the phase change material 22 is arranged above the electrical contact, "above" being defined with respect to a direction perpendicular to the substrate surface. Stated differently, the phase change material and the conductive contact 21 are arranged in such a way that current flows in the conductive contact in a direction perpendicular to the substrate surface.

Figure 10:
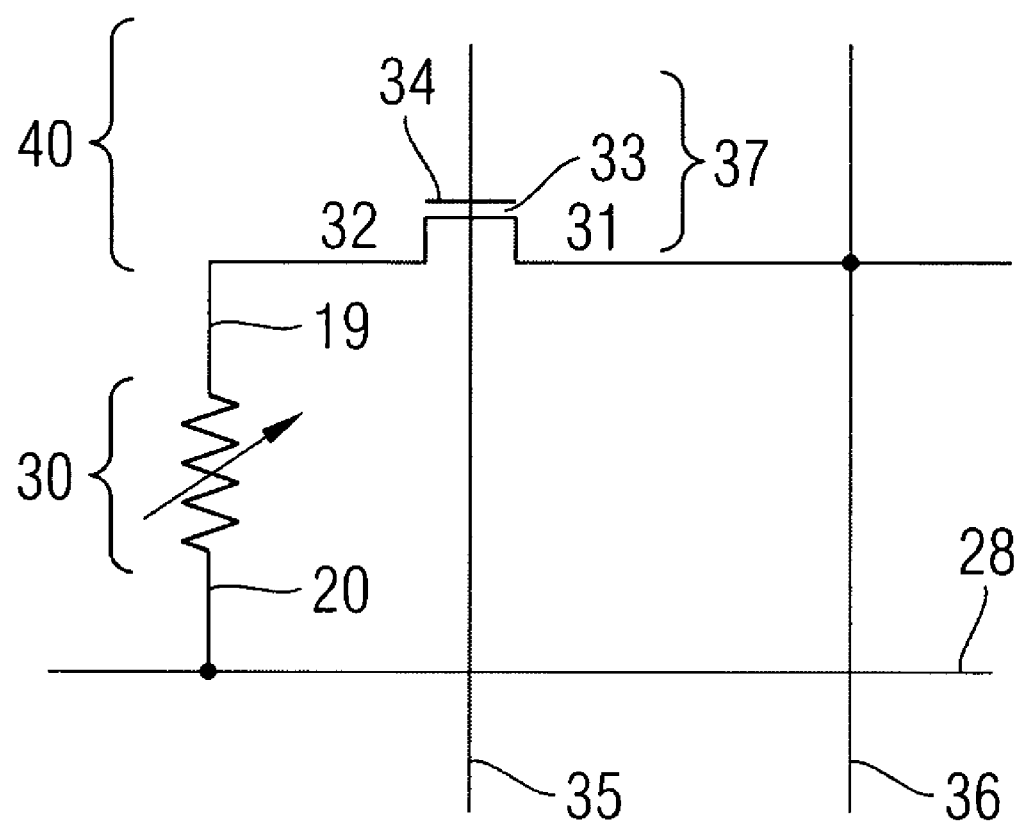
FIG. 10 shows a cross-section through a PCRAM memory cell according to an exemplary embodiment of the invention.

The operation of a memory cell arrangement having a phase change material is described below with reference to FIG. 10, which shows an equivalent circuit diagram of the memory cell with the device of FIG. 9.

A memory cell having phase change material comprises a selection transistor 37 and a memory node 30, which represents a resistance element having a variable resistance. The memory node is constructed in the manner illustrated in FIG. 9 and comprises a layer made of a phase change material. The second electrode 20 of the memory node 30 is connected to a bit line 28. The selection transistor 37 comprises a first source/drain region 31, a second source/drain region 32, a channel 33 arranged between the first and second source/drain regions 31, 32 and also a gate electrode 34 suitable for controlling the conductivity of the channel 33 by way of the field effect. The gate electrode 34 is driven by the word line 35 and forms a part of the word line 35. During a writing operation for writing a logic information item in the form of a "0" (a state with high resistance) or a "1" (a state with low resistance) to the memory node 30, a signal is applied to the word line 35, by which signal the channel 33 conducts an electric current between the first and second source/drain regions 31, 32 while the bit line 28 is grounded. A signal is then supplied via the connecting line 36. The signal supplied via the connecting line 36 corresponds to a current pulse having a magnitude and a duration corresponding to the logic information item to be written in. A current correspondingly flows between the connecting line 36 and the bit line 28 through the memory node 30. The layer made of phase change material of the memory node 30 alters its crystalline state in accordance with the current pulse, whereby the resistance of the memory node 30 is altered.

During a reading operation for reading the information stored in the memory node 30, a signal is applied to the word line 35, by which signal the selection transistor 37 is switched on, i.e., the channel 33 becomes conductive. The connecting line 36 is grounded, and an operating voltage is applied to the bit line 28. In this case, the operating voltage does not suffice for altering the crystalline state of the phase change material. Therefore, a current flows between the bit line 28 and the connecting line 36 via the memory node 30, and the resistivity of the phase change material is determined by the bit line 28. In accordance with the value of the resistivity determined, it is identified whether a "0" or a "1" is stored in the memory node 30.

As an alternative, the selection transistor may also be realized as a bipolar transistor, for example an npn transistor or a pnp transistor.

As is clear from the above description of the constitution of the phase change material, the memory described is a non-volatile memory. In other words, after a reading operation, the information does not have to be rewritten again, nor is it necessary for the information stored to be refreshed again at specific time intervals.

FIGS. 11 to 21 illustrate a second exemplary embodiment of the present invention in which a plurality of openings having a sub-lithographic dimension and a sub-lithographic spacing with respect to one another are formed.

Figure 11:
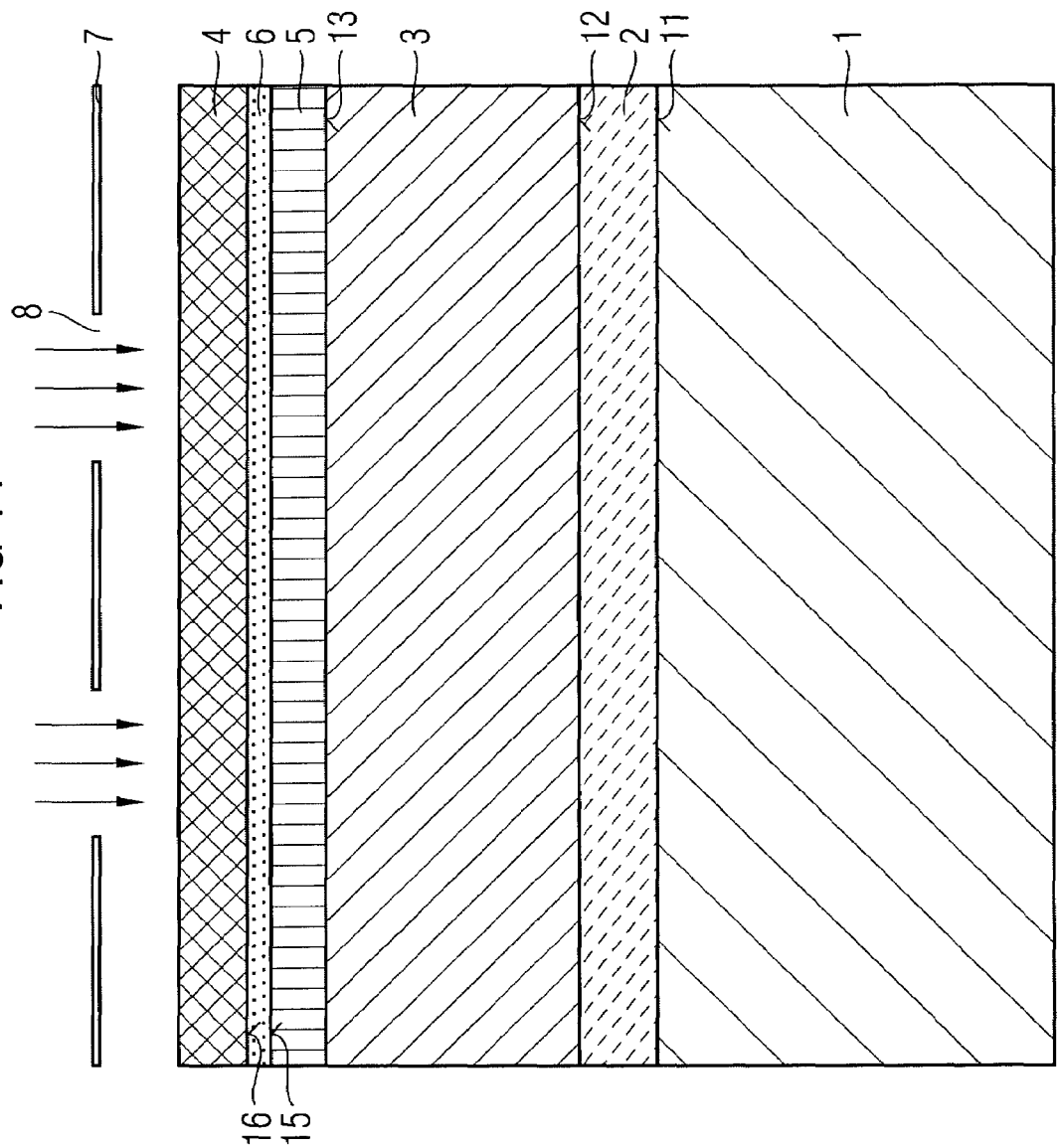
FIGS. 11-19 show a semiconductor structure at various stages of a manufacturing method according to a second exemplary embodiment of the present invention.

A layer 2 to be patterned is applied on the surface 11 of a substrate 1, for example a semiconductor substrate, in particular a silicon substrate or another arbitrary layer carrier, for example an already processed semiconductor wafer with a multiplicity of deposited and patterned layers. To carry out the method in accordance with the second embodiment of the present invention, a sacrificial layer 3, for example made of silicon dioxide, is applied on the surface 12 of the patterning layer, which may be constructed from silicon nitride, for example. A CMP stop layer 5, for example made of silicon nitride, is applied on the surface 13 of the sacrificial layer 3. A reflection-reducing layer 6, as is generally known, is applied on the surface of the CMP stop layer 5. A photoresist layer 4 is applied on the surface 16 of the reflection-reducing layer 6. The photoresist layer 4 is patterned photolithographically according to known methods using a mask 7 having openings 8. For this purpose, an exposure step is first performed, for example using an ArF excimer laser having a wavelength of 193 nm. This is illustrated in FIG. 11.

Figure 12:
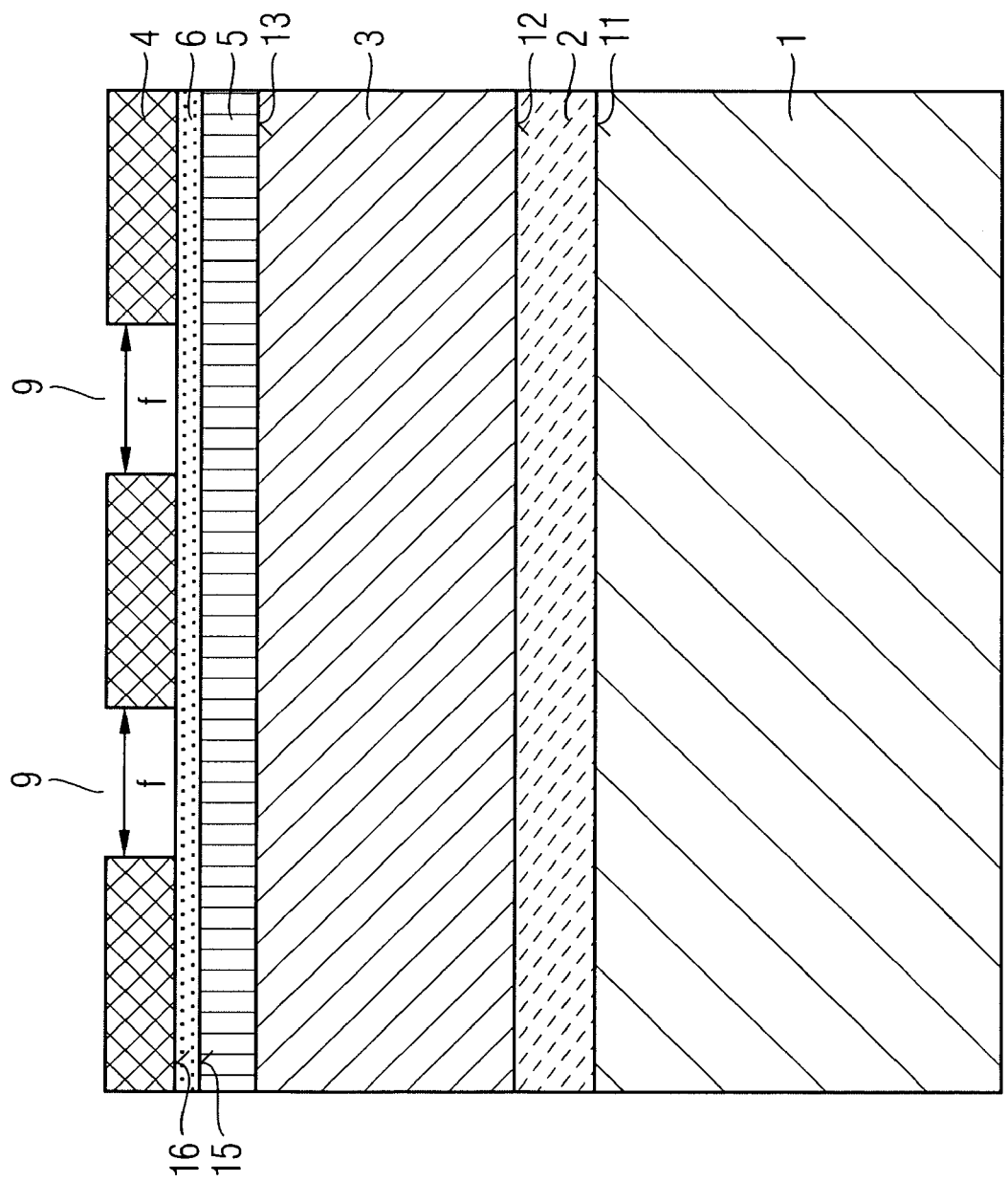

After the photoresist layer 4 has been developed, the construction shown in FIG. 12 results, in which openings 9 have been formed in the photoresist layer 4. The dimension of the openings 9 corresponds to the minimum feature size that can be obtained photolithographically.

Figure 13:
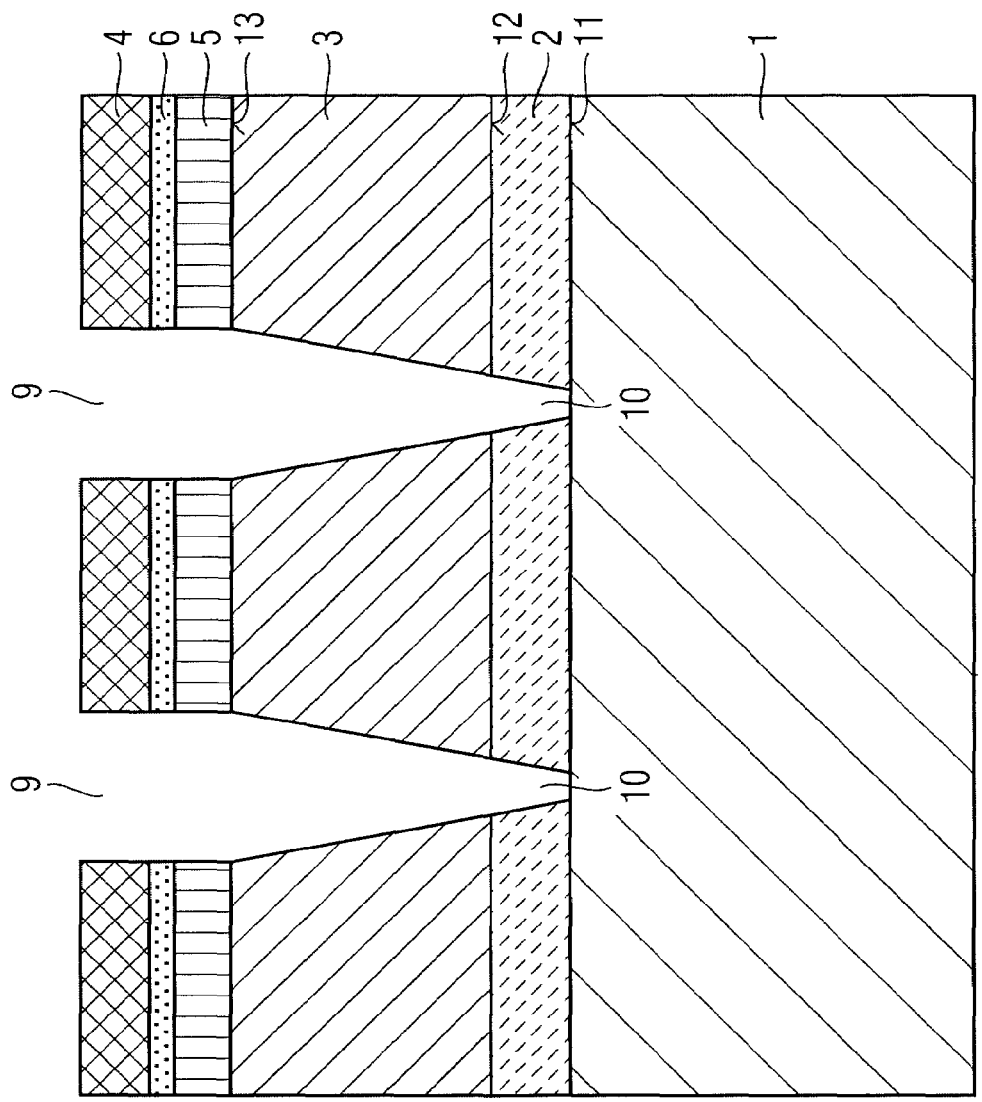
Figure 14:
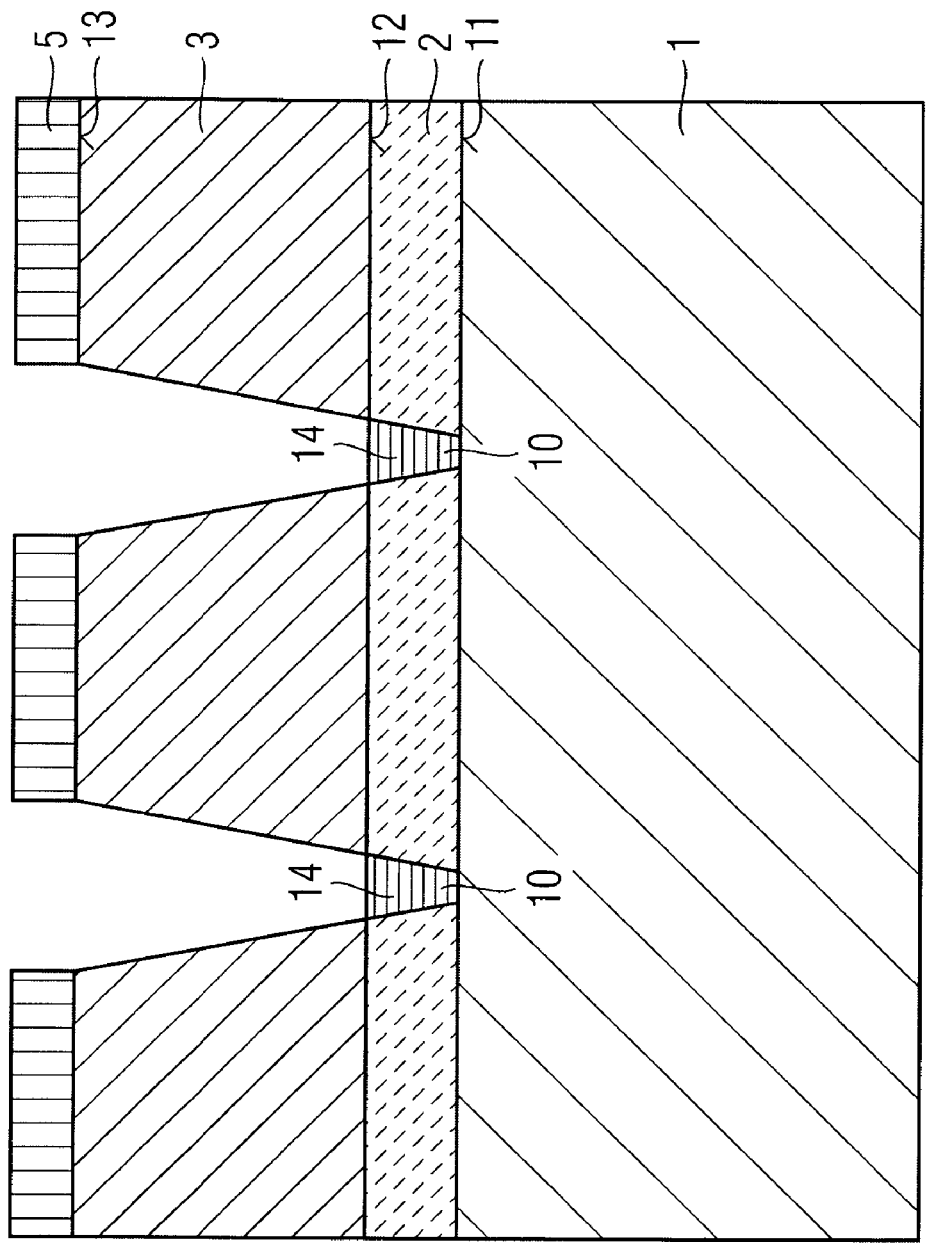
Figure 15:
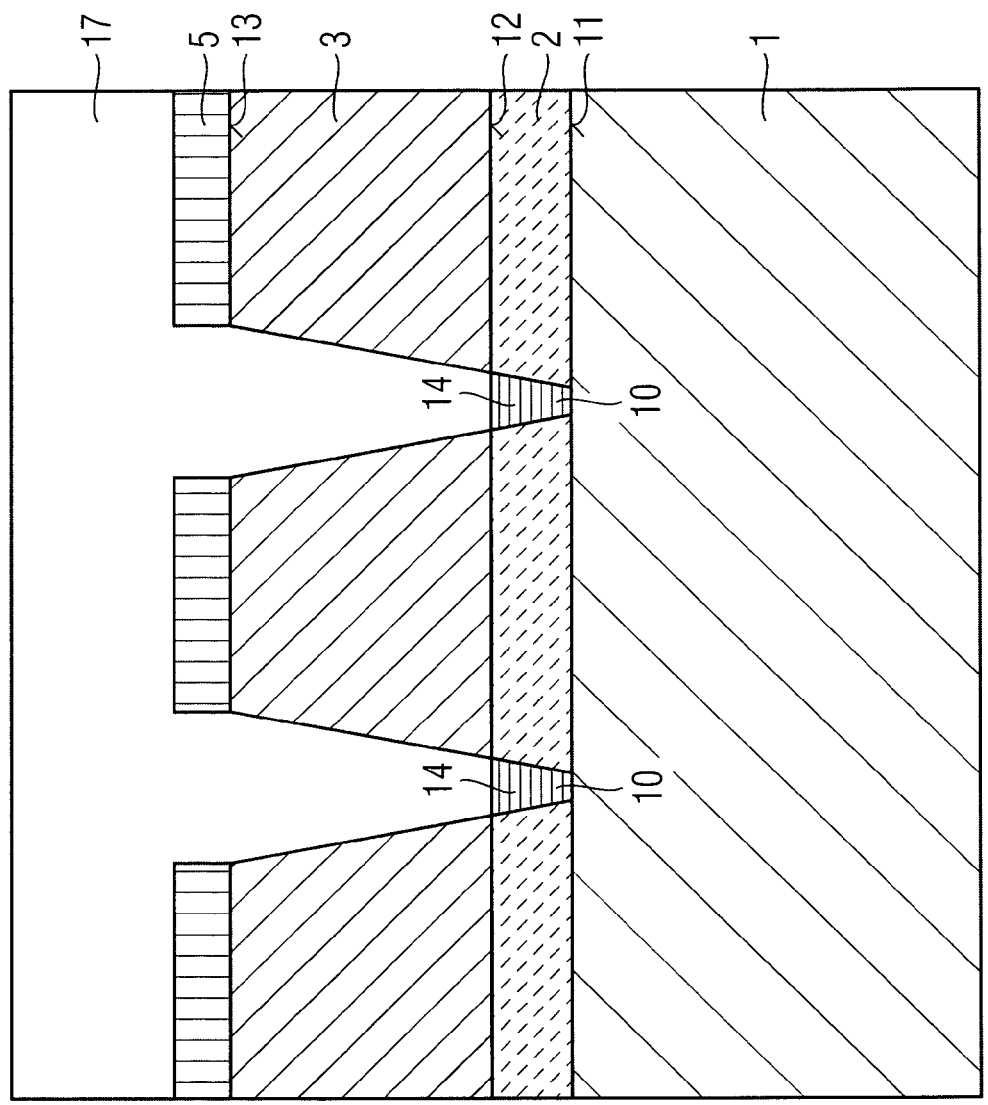

As is illustrated in FIG. 13, the layers lying below the photoresist layer 4 are subsequently etched. In this case, the reflection-reducing layer 6 and the CMP stop layer are preferably etched essentially perpendicularly, that is to say at an angle of approximately 90° with respect to the substrate surface. In a next step, the etching angle is set in a suitable manner taking account of the layer thickness of the sacrificial layer 3 and the patterning layer 2 and also the ratio between the dimension of the opening in the photoresist layer 4 and the dimension to be obtained in the patterning layer 2. This is again effected by setting the etching parameters in a suitable manner, when using a reactive ion etching method in particular by setting the flow rate, the substrate temperature, and/or the partial pressure of the etching gas used, such as argon by way of example.

The etching is then carried out at the etching angle set, with the result that the sacrificial layer 3 and the patterning layer 2 are etched. As a consequence, openings 10 whose dimension is substantially smaller than the dimension of the openings produced in the photoresist layer 4 are produced in the patterning layer 2.

Next, the photoresist layer 4 and the reflection-reducing layer 6 are removed according to known methods. A layer of the filling material 14 to be filled in is subsequently deposited according to known methods. In particular, a metal filling, for example, is deposited. That part of the filling material which projects from the openings 9 is removed by means of a CMP method, the layer 5 acting as a CMP stop layer. Finally, the filling material 14 filled in is etched back selectively. This may be achieved for example by setting the etching parameters in such a way that only the filling material 14 is etched. As an alternative, however, it is also possible for that region of the semiconductor surface at which no etching is intended to be performed to be masked by a suitable layer. The filling material 14 is etched back as far as the surface 12 of the patterning layer. This may be realized by a time-controlled etching, for example. The construction shown in FIG. 14 finally results.

Next, a dielectric layer 17, for example made of silicon dioxide, is deposited. The construction shown in FIG. 15 results.

Figure 16:
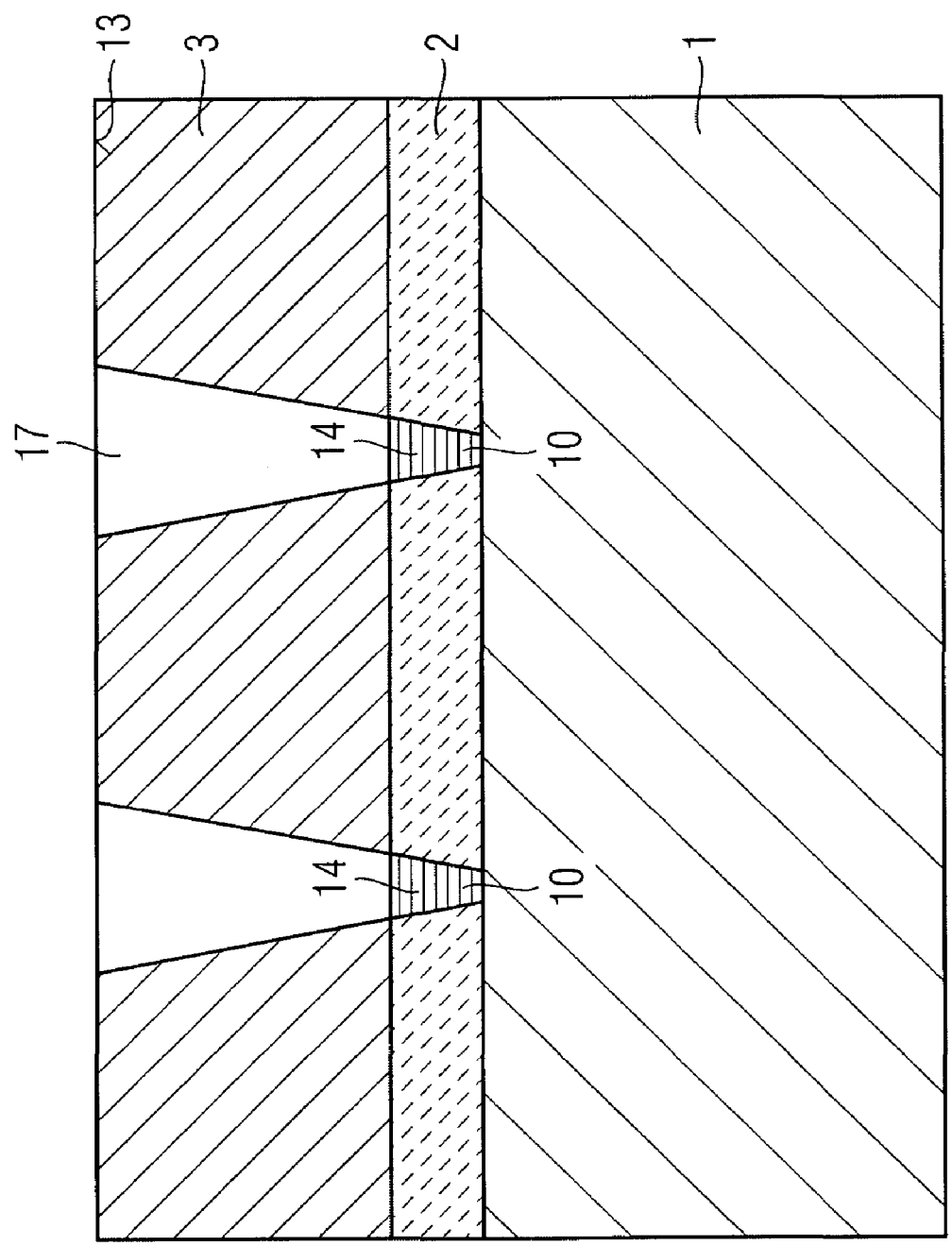

Afterward, as illustrated in FIG. 16, a CMP process is carried out, whereby the protruding part of the dielectric layer 17 and the CMP stop layer 5 are removed. More precisely, the CMP process stops on the surface 13 of the sacrificial layer 3. As a consequence, the regions above the regions filled with the filling material 14 are filled with the dielectric material 17, and the result is a uniform surface covered with dielectric material, as is shown in FIG. 16.

In order to produce openings with a sub-lithographic spacing, a reflection-reducing layer 16 and a photoresist layer 4 are again first applied on the resulting surface 13. Afterward, these layers are patterned photolithographically by known methods as described above. In particular, the mask 7 is positioned such that the openings in the mask 7 lie precisely between two adjacent openings 10 in the patterning layer 2. In this case, the mask 7 is oriented using orientation or alignment marks such as are customarily used in lithography.

Figure 17:
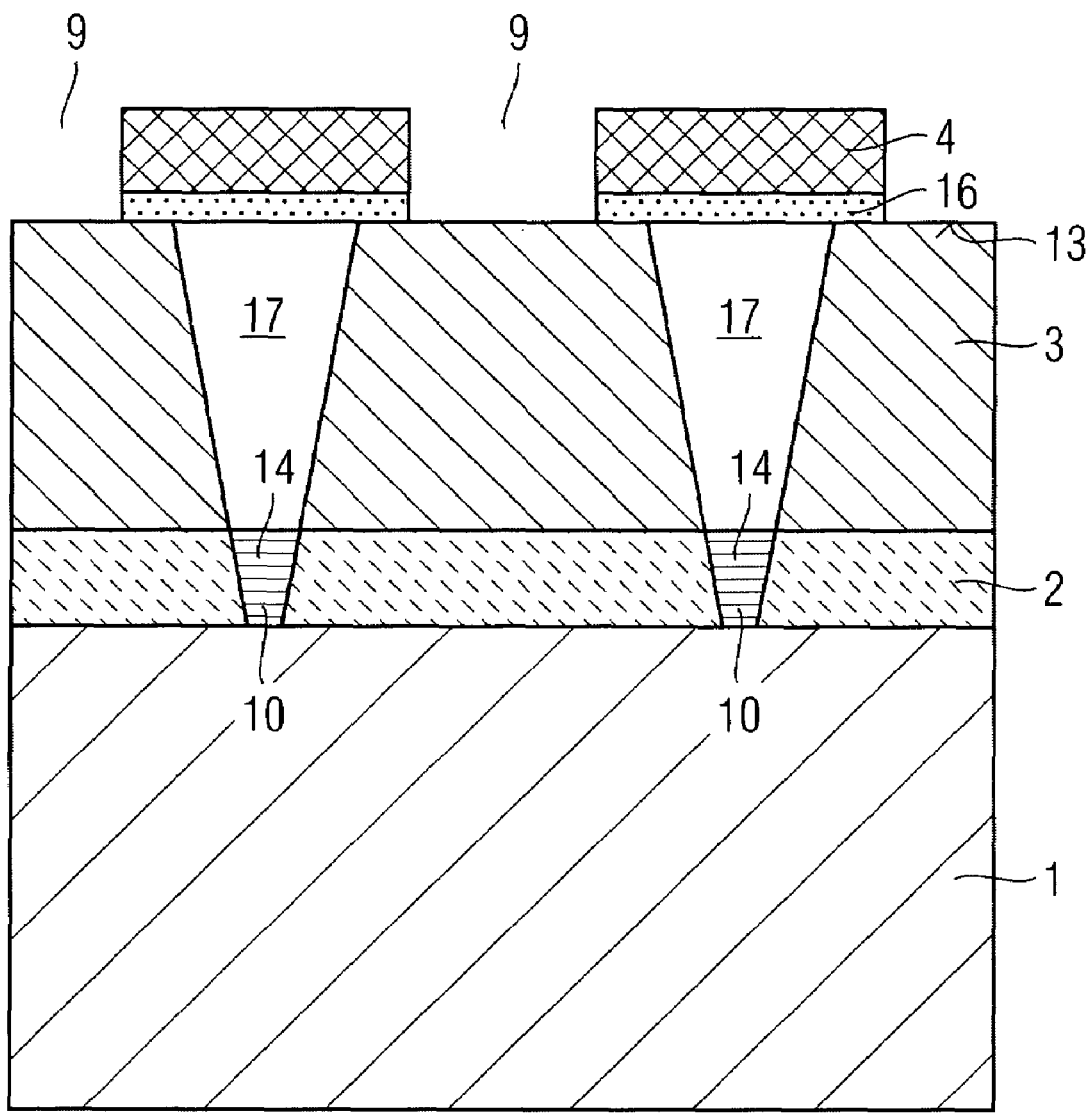

As is shown in FIG. 17, the mask 7 is oriented such that the openings 9 in the photoresist layer 4 lie precisely between two adjacent openings in the patterning layer 2. However, the orientation may alternatively also be effected such that the openings 9 are slightly offset towards the right or left, depending on the desired spacing of the opening in the patterning layer 2.

Figure 18:
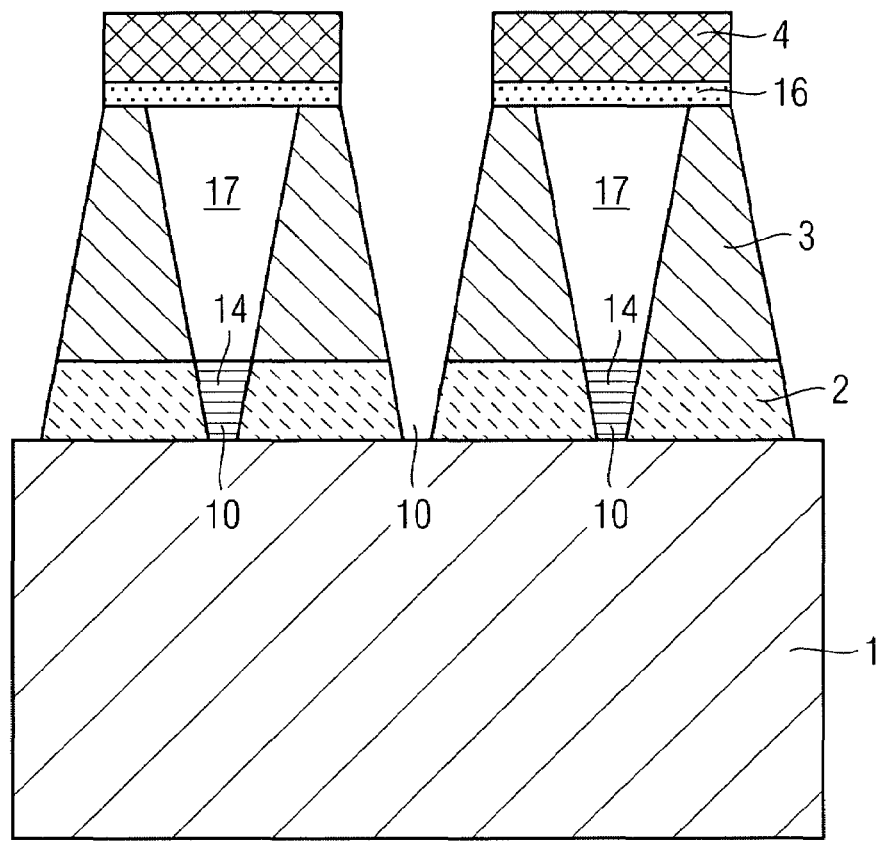

Next, an etching angle for the etching of the sacrificial layer 3 is once again set by suitable setting of the etching parameters, such as for example, a flow rate, a substrate temperature, and/or partial pressure of the etching gas in the case of, for example, the reactive ion etching method. The etching angle is again determined in accordance with the thickness of the sacrificial layer 3, the thickness of the patterning layer 2, and also the ratio between the dimension of the opening 9 in the photoresist layer 4 and the dimension of the opening to be produced in the patterning layer 2. The etching is performed, both the sacrificial layer 3 and the patterning layer 2 being etched. The resulting construction is shown in FIG. 18.

Next, the photoresist layer 4 and the reflection-reducing layer 6 are removed according to known methods. Afterwards, the filling material 14 is applied over the whole area and the region of the filling material 14 outside the opening produced is removed by a CMP process. A further CMP process is subsequently performed, the CMP process stopping on the patterning layer 2, thus resulting in the construction shown in FIG. 19.

As an alternative to the method sequence described, however, it is also possible, of course, firstly to remove the sacrificial layer 3 and subsequently to apply the filling material 14 and to remove the portion situated on the surface 12 of the patterning layer 2 by a CMP process that stops on the surface 12 of the patterning layer 2.

Figure 19:
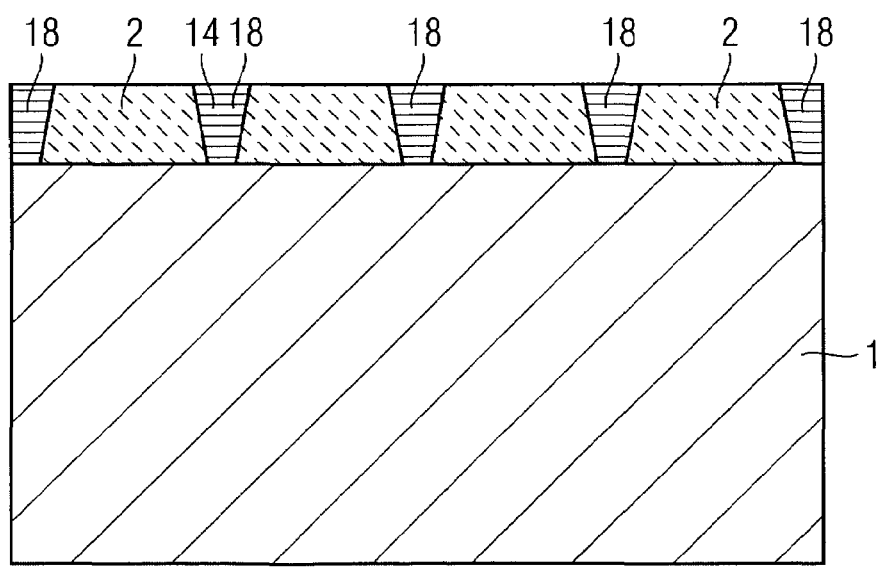

As shown in FIG. 19, a plurality of contact structures 18 have now been produced in the patterning layer 2. The contact structures 18 are filled with the filling material 14. The contact structures 18 have a dimension which is smaller than the minimum feature size that can be obtained lithographically. Furthermore, the spacing between two adjacent contact structures is also smaller than the resolution that can be achieved lithographically. Consequently, it is possible according to the present invention to produce structures which are filled with a filling material and whose dimension is smaller than the feature size that can be obtained lithographically, and whose spacing with respect to one another is also smaller than the feature size that can be obtained lithographically.

The techniques of the present invention have many fields of application.

Figure 20:
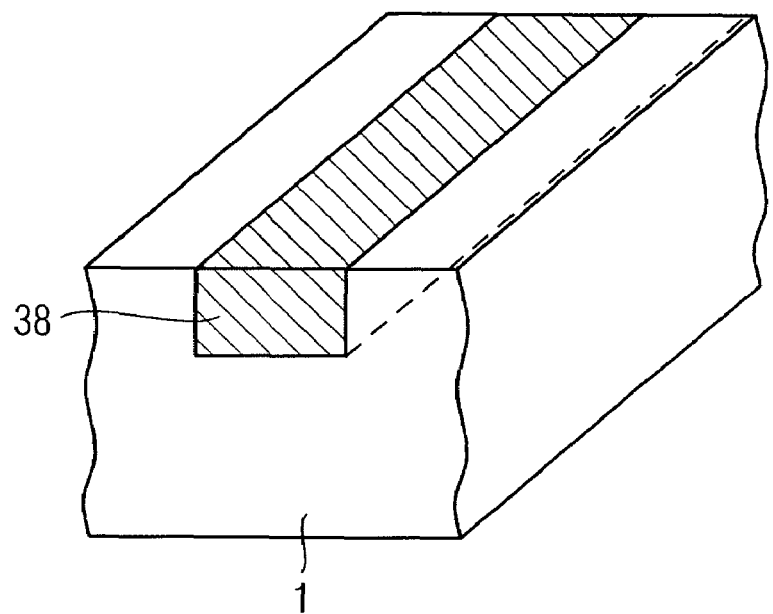
FIGS. 20 and 21 show an exemplary application of the second exemplary embodiment of the present invention.
Figure 21:
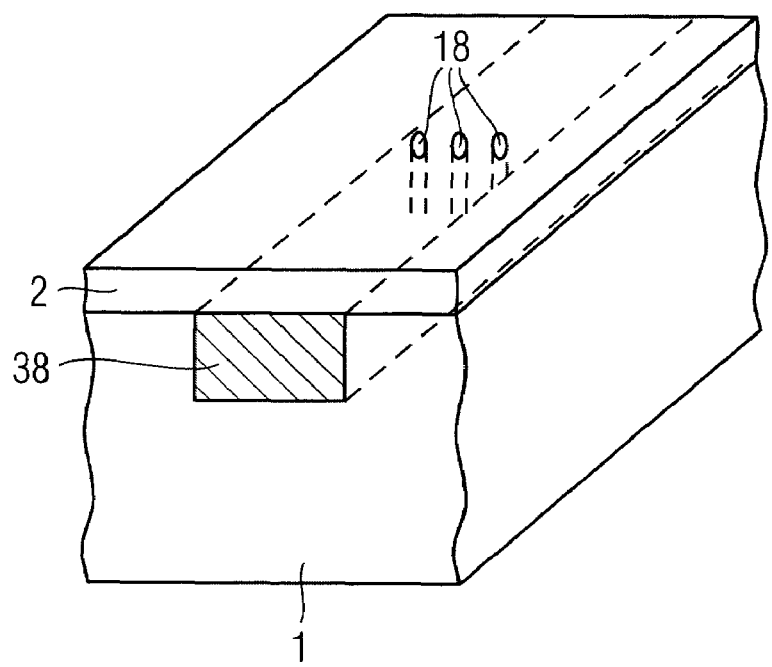

One specific field of application is for example the contact-connection of interconnects, as illustrated in FIGS. 20 and 21.

In FIG. 20, an interconnect 38 is buried in a substrate 1. In accordance with the second embodiment of the present invention, it is possible for the interconnect 38 to be contact-connected at a plurality of locations such that the associated contact structures 18 are not arranged along the longitudinal direction of the interconnect, but rather along the width direction of the interconnect. This is because, due to the reduced spacing of the contact structures with respect to one another, it is possible to arrange the contact structures in a direction perpendicular to the longitudinal direction of the interconnect 38. As a consequence, a plurality of contacts can be placed on an interconnect without thereby increasing the space requirement of the contacts. A plurality of contacts on an interconnect are advantageous to the effect that the yield of the resulting component can be increased. Furthermore, a better ohmic contact to the interconnect also results, whereby the switching speed of the component can be increased and the performance of the component can be improved. Given a metallization having a width of 100 nm, it is possible, for example, to arrange three contacts one beside the other on the interconnect 38. Application of the method described in FIGS. 11 to 19 results in the construction illustrated in FIG. 21, in which three contact structures 18 lying one beside the other have been formed in a patterning layer 2, for example a dielectric material on the interconnect 38.

The method in accordance with the second embodiment of the present invention may also be used if, for example, an active material such as a phase change material for a PCRAM is introduced into the openings produced in the patterning layer 2. Consequently, application of the method according to the invention makes it possible to arrange many memory cells one beside the other.

Stated differently, the second embodiment of the invention relates to a method for producing a plurality of openings which are filled with a filling material and have a first dimension in a patterning layer, where the method comprises applying a sacrificial layer made of a material that is different from that of the patterning layer, in a predetermined layer thickness on the surface of the patterning layer, applying a resist layer on the resulting surface, lithographically defining an opening having a second dimension in the resist layer, the second dimension being greater than the first dimension, setting an etching angle in a manner dependent on the layer thickness of the sacrificial layer and also the first and second dimensions, etching the sacrificial layer at the etching angle set, etching the patterning layer, an opening being produced in the patterning layer, introducing a filling material into the opening produced in the patterning layer, so that the filling material is not present in the opening in the sacrificial layer, filling the opening in the sacrificial layer with a material layer, applying a resist layer on the resulting surface, lithographically defining an opening having a second dimension in the resist layer at a location which does not lie directly above the opening filled with the filling material in the patterning layer, the second dimension being greater than the first dimension, setting an etching angle in a manner dependent on the layer thickness of the sacrificial layer and also the first and second dimensions, etching the sacrificial layer at the etching angle set, etching the patterning layer, a further opening being produced in the patterning layer, introducing the filling material into the opening produced in the patterning layer, and removing the sacrificial layer.

Figure 22:
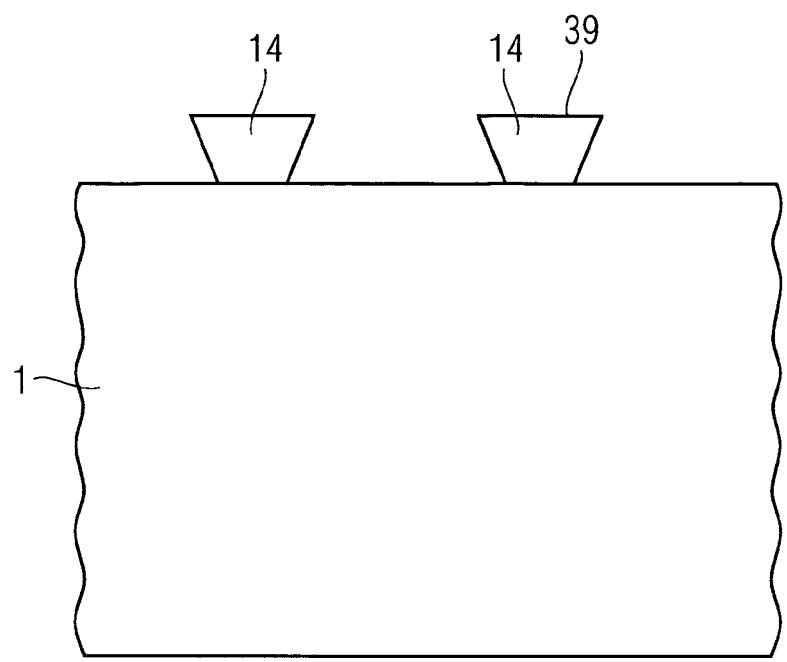
FIGS. 22 and 23 show a third exemplary embodiment of the present invention.
Figure 23:
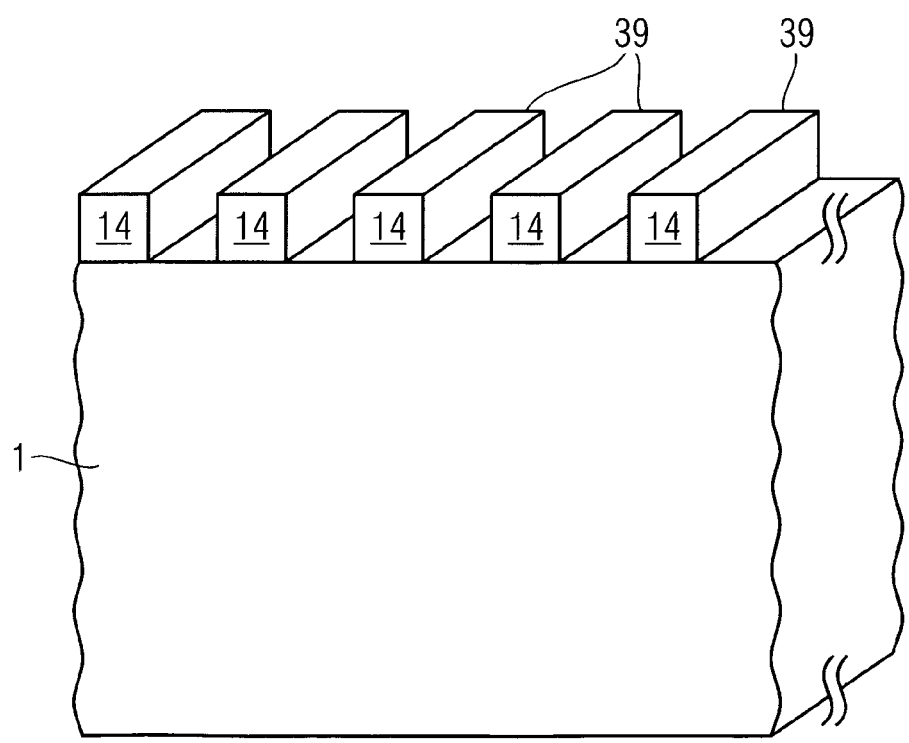

FIGS. 22 and 23 illustrate a third exemplary embodiment of the present invention.

To produce the structure illustrated in FIG. 22, firstly the method described with reference to FIGS. 1 to 5 or 1 to 6 is performed. The structure illustrated in FIG. 22 is finally obtained by removing the patterning layer 2.

In FIG. 22, a plurality of projecting structures 39 made of a material 14 are arranged on a substrate surface. In this case, the dimension of the structures produced in the cross-sectional plane illustrated is preferably smaller than the resolution that can be obtained lithographically. In this case, in a cross-sectional plane running perpendicular to the cross-sectional plane illustrated, the projecting structures 39 may have a dimension of identical magnitude or a larger dimension or, alternatively, as shown in FIG. 23, may be realized as a type of quantum wire if a strip mask having strip-type openings is used as the exposure mask.

To produce the structure illustrated in FIG. 23, the method described with reference to FIGS. 1, 2 and 7 is performed. The structure illustrated in FIG. 23 is finally obtained by removing the patterning layer 2. A strip mask having strip-type openings is used as the exposure mask.

The filling material 14 in the production of the projecting structures shown in FIGS. 22 and 23 may be one of those mentioned above. However, the filling material used may be, in particular, a substrate material, for example monocrystalline semiconductor material applied by a selective epitaxy method.

Structures of this type may be employed for example in photonic fields of application.

However, the filling material may also be for example a material which serves as a covering material during a subsequent step for etching the substrate.

The openings at least partly filled with a filling material, or alternatively the projecting structures, which are produced by the method according to the invention can be used in many areas in addition to those described, in particular for the production of contacts, interconnects, but also in photonic or micromechanical fields of application.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS

1 Substrate
2 Layer to be patterned
3 Sacrificial layer
4 Photoresist layer
5 Stop layer
6 ARC layer
7 Mask
8 Mask opening
9 Opening in the photoresist
10 Opening in the patterning layer
11 Substrate surface
12 Surface of the layer to be patterned
13 Surface of the sacrificial layer
14 Filling material
15 Surface of the stop layer
16 Surface of the ARC layer
17 Dielectric layer
18 Contact structure
19 First electrode
20 Second electrode
21 Conductive contact (heater)
22 Phase change material
23 Volume to be programmed
24 Dielectric layer
25 Contact
26 Dielectric layer
27 Dielectric layer
28 Bit line
29 Contact
30 Memory node
31 First source/drain region
32 Second source/drain region
33 Conductive channel
34 Gate electrode
35 Word line
36 Connecting line
37 Selection transistor
38 Interconnect
39 Projecting structure
40 Memory cell

What is claimed is:

1. A method for producing an integrated circuit having a memory, comprising:
   providing a selection transistor having a first terminal and a second terminal, a channel arranged between the first and second terminals, and a control terminal suitable for controlling a conductivity of the channel; and
   providing a memory element comprising a phase change material and a conductive contact connected to the phase change material and the second terminal of the selection transistor, the conductive contact formed in an opening having a first dimension in a patterning layer, the conductive contact being produced by a method comprising:
      applying a sacrificial layer made of a material that is different from that of the patterning layer in a predetermined layer thickness on a surface of the patterning layer;
      applying a resist layer on the resulting surface;
      lithographically defining an opening having a second dimension in the resist layer, the second dimension being greater than the first dimension;
      setting an etching angle in a manner dependent on the thickness of the sacrificial layer and the first and second dimensions;
      etching the sacrificial layer at the etching angle set;
      etching the patterning layer to produce the opening in the patterning layer;
      removing the sacrificial layer; and
      introducing a filling material into the opening produced in the patterning layer.

2. The method of claim 1, wherein the conductive contact is produced to have a dimension in the range of approximately 1 to 70 nm.

3. The method of claim 1, wherein the phase change material contains at least one element from a group consisting of: Te, Se, Ge, Sb, In, Bi, Pb, Ag, Au, Cu, Sn, As, S, Si, P, and O.

4. The method of claim 1, wherein the filling material is a conductive or a semiconductor material.

5. The method of claim 1, wherein providing the selection transistor comprises providing a bipolar transistor having an emitter terminal, a collector terminal, and a base terminal serving as a control terminal.

6. The method of claim 1, wherein providing the selection transistor comprises providing a field effect transistor having a first and second source/drain region and a gate electrode serving as the control terminal.

7. The method of claim 1, wherein providing the memory element further comprises providing a first electrode connected to the second terminal of the selection transistor and to the conductive contact, and a second electrode connected to the phase change material.

8. A method for fabricating an integrated circuit, the method comprising:
    providing a preprocessed wafer including a patterning layer and a sacrificial layer over the patterning layer;
    etching the sacrificial layer to provide a first opening having tapered sidewalls exposing a portion of the patterning layer;
    etching the exposed portion of the patterning layer to provide a second opening having a sub-lithographic cross-section;
    at least partially filling the second opening with a contact material;
    removing the sacrificial layer;
    depositing a phase change material over the contact material;
    depositing an electrode material over the phase change material; and
    etching the electrode material and the phase change material to provide a memory cell.

9. The method of claim 8, wherein etching the exposed portion of the patterning layer comprises etching the exposed portion of the patterning layer to provide the second opening have tapered sidewalls.

10. A method for fabricating an integrated circuit, the method comprising;
    providing a preprocessed wafer including a patterning layer and a sacrificial layer over the patterning layer;
    etching the sacrificial layer to provide a first opening having tapered sidewalls exposing a portion of the patterning layer;
    etching the exposed portion of the patterning layer to provide a second opening having a sub-lithographic cross-section; and
    at least partially filling the second opening with a filling material, wherein at least partially filling the second opening comprises at least partially filling the second opening with a phase change material.

11. The method of claim 10, further comprising:
    removing the sacrificial layer;
    depositing electrode material over the phase change material; and
    etching the electrode material to provide a memory cell.

* * * * *